(12) United States Patent
Mann

(10) Patent No.: US 8,967,817 B2
(45) Date of Patent: Mar. 3, 2015

(54) IMAGING OPTICAL SYSTEM WITH AT MOST 11.6% OF THE ILLUMINATED SURFACES OF THE PUPIL PLANE BEING OBSCURED

(71) Applicant: Carl Zeiss SMT-GmbH, Oberkochen (DE)

(72) Inventor: Hans-Juergen Mann, Oberkochen (DE)

(73) Assignee: Carl Zeiss SMT GmbH, Oberkochen (DE)

( * ) Notice: Subject to any disclaimer, the term of this patent is extended or adjusted under 35 U.S.C. 154(b) by 0 days.

(21) Appl. No.: 14/013,066

(22) Filed: Aug. 29, 2013

(65) Prior Publication Data

US 2013/0342821 A1  Dec. 26, 2013

Related U.S. Application Data

(63) Continuation of application No. 13/481,431, filed on May 25, 2012, which is a continuation of application No. 13/205,278, filed on Aug. 8, 2011, now Pat. No. 8,208,200, which is a continuation of application (Continued)

(30) Foreign Application Priority Data

Jan. 17, 2007 (DE) .......................... 10 2007 003 305

(51) Int. Cl.
*G02B 5/10* (2006.01)
*G03F 7/20* (2006.01)
*G02B 17/06* (2006.01)

(52) U.S. Cl.
CPC ............ *G03F 7/702* (2013.01); *G02B 17/0663* (2013.01); *G03F 7/70233* (2013.01); *G02B 17/06* (2013.01); *G02B 17/0647* (2013.01)

USPC .......... 359/859; 359/857; 359/858; 359/861; 355/45

(58) Field of Classification Search
USPC ......... 359/351, 364–366, 850, 857–859, 861; 355/30, 43, 45, 46, 53–55, 57, 60, 66, 355/67, 72, 77; 356/399–401
See application file for complete search history.

(56) References Cited

U.S. PATENT DOCUMENTS

| 6,000,798 A | 12/1999 | Chipman et al. |
| 6,109,756 A | 8/2000 | Takahashi |

(Continued)

FOREIGN PATENT DOCUMENTS

| DE | 102 12 405 | 10/2002 |
| DE | 103 59 576 | 7/2005 |

(Continued)

OTHER PUBLICATIONS

Japanese office action, with English translation thereof, for corresponding JP Appl No. 2008-006616, dated May 27, 2013.

(Continued)

*Primary Examiner* — Frank Font
(74) *Attorney, Agent, or Firm* — Fish & Richardson P.C.

(57) ABSTRACT

The disclosure generally relates to imaging optical systems that include a plurality of mirrors, which image an object field lying in an object plane in an image field lying in an image plane, where at least one of the mirrors has a through-hole for imaging light to pass through. The disclosure also generally relates to projection exposure installations that include such imaging optical systems, methods of using such projection exposure installations, and components made by such methods.

31 Claims, 14 Drawing Sheets

Related U.S. Application Data

11/971,640, filed on Jan. 9, 2008, now Pat. No. 8,018,650.

(60) Provisional application No. 60/885,261, filed on Jan. 17, 2007.

(56) References Cited

U.S. PATENT DOCUMENTS

| | | |
|---|---|---|
| 6,172,825 B1 | 1/2001 | Takahashi |
| 6,213,610 B1 | 4/2001 | Takahashi et al. |
| 6,229,595 B1 | 5/2001 | McKinley et al. |
| 6,244,717 B1 | 6/2001 | Dinger |
| 6,266,389 B1 | 7/2001 | Murayama et al. |
| 6,270,224 B1 | 8/2001 | Sunaga et al. |
| 6,353,470 B1 | 3/2002 | Dinger |
| 6,464,363 B1 | 10/2002 | Nishioka et al. |
| 6,631,036 B2 | 10/2003 | Schuster |
| 6,660,552 B2 | 12/2003 | Payne et al. |
| 6,710,917 B2 | 3/2004 | Mann et al. |
| 6,750,948 B2 | 6/2004 | Omura |
| 6,842,298 B1 | 1/2005 | Shafer et al. |
| 6,894,834 B2 | 5/2005 | Mann et al. |
| 6,902,283 B2 | 6/2005 | Dinger |
| 6,922,291 B2 | 7/2005 | Sunaga et al. |
| 6,929,373 B2 | 8/2005 | Yoshikawa et al. |
| 6,947,210 B2 | 9/2005 | Terasawa |
| 7,070,289 B2 | 7/2006 | Sasaki et al. |
| 7,114,818 B2 | 10/2006 | Minakata |
| 7,414,781 B2 | 8/2008 | Mann et al. |
| 7,682,031 B2 | 3/2010 | Mann et al. |
| 7,712,905 B2 | 5/2010 | Shafer et al. |
| 2003/0058555 A1 | 3/2003 | Takino |
| 2003/0147128 A1 | 8/2003 | Shafer et al. |
| 2004/0070743 A1 | 4/2004 | Hudyma et al. |
| 2004/0189968 A1 | 9/2004 | Terasawa |
| 2005/0134980 A1 | 6/2005 | Mann et al. |
| 2005/0248861 A1 | 11/2005 | Minakata |
| 2006/0055907 A1 | 3/2006 | Kato et al. |
| 2006/0232867 A1 | 10/2006 | Mann et al. |
| 2006/0284113 A1 | 12/2006 | Chang et al. |
| 2007/0195317 A1 | 8/2007 | Schottner et al. |
| 2008/0068572 A1* | 3/2008 | Kudo et al. .................. 355/53 |
| 2011/0038039 A1 | 2/2011 | Takaura et al. |

FOREIGN PATENT DOCUMENTS

| | | |
|---|---|---|
| DE | 10 2005 042 005 A1 | 7/2006 |
| EP | 0 744 665 | 11/1996 |
| EP | 1 093 021 A2 | 4/2001 |
| EP | 1 333 260 A2 | 8/2003 |
| EP | 1 335 228 A1 | 8/2003 |
| EP | 1 434 093 | 6/2004 |
| EP | 1 450 196 A1 | 8/2004 |
| EP | 1 452 899 A1 | 9/2004 |
| EP | 1 806 610 | 7/2007 |
| JP | 62210415 | 9/1987 |
| JP | 62258414 | 11/1987 |
| JP | 2001-185480 | 7/2001 |
| JP | 2002-015979 | 1/2002 |
| JP | 2002-139672 | 5/2002 |
| JP | 2003-222572 | 8/2003 |
| JP | 2003-233002 | 8/2003 |
| JP | 2004-029625 | 1/2004 |
| JP | 2004-512552 | 4/2004 |
| JP | 2004-516500 | 6/2004 |
| JP | 2004-214242 | 7/2004 |
| JP | 2004-525398 | 8/2004 |
| JP | 2005-055553 | 3/2005 |
| JP | 2005-172988 | 6/2005 |
| TW | 594043 | 6/2004 |
| TW | 200632372 A | 9/2006 |
| WO | WO 01/88597 | 11/2001 |
| WO | WO 02/48796 | 6/2002 |
| WO | WO 02/056114 | 7/2002 |
| WO | WO 2006/046507 | 5/2006 |
| WO | WO 2006/069725 | 7/2006 |

OTHER PUBLICATIONS

B. Tatian, "Nonrotationally Symmetric Systems: A New Problem for Optical Design and Fabrication, Applications of Geometrical Optics", Proc. SPIE, 39:205, (1973).

B. Tatian, "Testing an Unusual Optical Surface", International Lens Design Conference, Proc. SPIE, 554:139, (1985).

Bal, Matthieu Frédéric, dissertation "Next-Generation Extreme Ultraviolet Lithographic Projection Systems", pp. 1-139, (Feb. 10, 2003).

Office Action for corresponding Application No. JP 2008-529565, dated Dec. 7, 2009.

English translation of Office Action for corresponding Application No. JP 2008-529565, dated Feb. 21, 2011.

Japanese Office Action, with English translation, for JP Appl No. 2008-006616, dated Oct. 29, 2012.

Taiwanese office action, with English translation thereof, for TW Appl No. 97 101 634, dated Sep. 10, 2013.

Japanese office action, with English translation thereof, for JP Appl No. 2008-006616, dated Jul. 22, 2014.

Japanese office action with English translation thereof, for JP Appl No. 2013-202509, dated Jun. 19, 2014.

Taiwanese Office Action and search report, with English translation, for TW Appl No. 097101634, dated May 16, 2014.

* cited by examiner

IMAGING OPTICAL SYSTEM WITH AT MOST 11.6% OF THE ILLUMINATED SURFACES OF THE PUPIL PLANE BEING OBSCURED

CROSS-REFERENCE TO RELATED APPLICATIONS

This application is a continuation of U.S. application Ser. No. 13/481,431, filed May 25, 20012, which is a continuation of U.S. application Ser. No. 13/205,278, filed Aug. 8, 2011, now U.S. Pat. No. 8,208,200, which is a continuation of U.S. application Ser. No. 11/971,640, filed Jan. 9, 2008, now U.S. Pat. No. 8,018,650, which claims priority under 35 U.S.C. §119(e)(1) to U.S. Ser. No. 60/885,261, filed Jan. 17, 2007, which claims priority under 35 U.S.C. §119 to German patent application serial number 10 2007 003 305.4, filed Jan. 17, 2007. These applications are incorporated herein by reference in their entirety.

FIELD

The disclosure generally relates to imaging optical systems that include a plurality of mirrors, which image an object field lying in an object plane in an image field lying in an image plane, where at least one of the mirrors has a through-hole for imaging light to pass through. The disclosure also generally relates to projection exposure installations that include such imaging optical systems, methods of using such projection exposure installations, and components made by such methods.

BACKGROUND

Imaging optical systems are known as projection optical systems as a component of projection exposure installations for microlithography. Imaging optical systems are also known in conjunction with microscope lenses for inspecting masks or wafers.

SUMMARY

In one aspect, the disclosure features an imaging optical system that includes a plurality of mirrors configured to image an object field lying in an object plane in an image field lying in an image plane. At least one of the mirrors has a through-hole configured so that imaging light can pass therethrough. A reflection surface of at least one mirror is in the form of a free-form surface which cannot be described by a rotationally symmetrical function.

In another aspect, the disclosure provides a projection exposure installation that includes an imaging optical system as described in the preceding paragraph, and a lens system configured to direct illumination light to the object field of the imaging optical system. The projection exposure installation is a projection exposure installation for microlithography.

In a further aspect, the disclosure provides a method that includes using the projection exposure installation described in the preceding paragraph to produce a microstructure on a wafer.

In some embodiments, the disclosure provides an imaging optical system wherein a reflection surface of at least one mirror is in the form of a free-form surface which cannot be described by a rotationally symmetrical function.

It has been recognized that using free-form surfaces instead of reflection surfaces having a rotationally symmetrical axis provides a new level of design freedom which results in imaging optical systems with combinations of properties which are not possible with rotationally symmetrical reflection surfaces. The free-form surface cannot be described by a function which is rotationally symmetrical about a marked axis representing a normal axis to a surface portion of the optical surface. The free-form surface thus cannot be defined in particular by a conic section-aspheric equation. Aspheres of this conic type deviate from spherical symmetry but can be described, however, by a rotationally symmetrical function, namely a function which is dependent on only one parameter, namely the distance to an optical axis, whereas the free-form surfaces require at least two parameters which are independent of one another to describe the surface. Conic section-aspheric surfaces are therefore not free-form surfaces. The shape of a boundary of the optically effective surface is not significant. Optically effective surfaces which are not bounded in a rotationally symmetrical manner are known. Optically effective surfaces of this type can nevertheless be described by a rotationally symmetrical function, a non-rotationally-symmetrically bounded portion of this optical surface being used. The free-form surface may be a static free-form surface. The term "static free-form surface" refers to a free-form surface, the shape of which is not actively modified during use of projection in the projection optical system. A static free-form surface can of course be displaced for adjustment purposes. The free-form surface can, in particular, be constructed on the basis of a planar reference surface or basic shape, a concave reference surface or a convex reference surface. In particular, at least one free-form surface may be used which is constructed on the basis of a curved reference surface. In this case, a reference surface with a vertex curvature which is constant over the entire reference surface can be used. A conic section-asphere may also be used as a reference surface. In conventional imaging optical systems including a through-hole, which are known as pupil-obscured systems, the use of this type of free-form surfaces can enable compact imaging optical systems with a low level of imaging errors to be achieved and, in particular, a high light throughput to be produced. According to the number of mirrors in the imaging optical system, a single mirror, or a plurality of mirrors, or all of the mirrors of the imaging optical system may be in the form of free-form surfaces. The free-form surfaces can have a maximum deviation from a rotationally symmetrical surface, which is best-fitted on the free-form surface and which does not necessarily match a designed reference surface, of at least the value of the wavelength of the imaging light. The deviation of, in particular, at least the value of a wavelength of the imaging light is, in practice, always markedly greater than the manufacturing tolerances during production of optical components for microlithography which, in absolute terms, are conventionally 0.1 nm and, in relative terms, are conventionally $\frac{1}{50}$ or $\frac{1}{100}$ of the wavelength of the illumination light used. In the case of illumination with EUV wavelengths, the deviation is at least several tens of nm, for example 50 nm. Larger deviations, for example 100 nm, 500 nm or 1,000 nm or even larger deviations are also possible. When using systems with imaging light of higher wavelengths, even greater deviations are possible. A free-form surface may be provided, for example, by a biconical surface, i.e. an optical surface with two different basic curves and two different conical constants in two directions perpendicular to one another, by a toric surface or an anamorphic and, at the same time, in particular, aspheric surface. A cylindrical surface therefore also represents a free-form surface of this type. The free-form surfaces may be mirror symmetrical to one or more planes of symmetry. The free-form surface can be a surface with n-fold symmetry, n being a whole number and greater than or equal to 1. The free-form surface may also have no axis of symmetry and no plane of symmetry at all.

Different ways of describing optical surfaces, in particular anamorphic surfaces, are described in U.S. Pat. No. 6,000,798, for example, which is hereby incorporated by reference. Analytical formulae for describing non-rotationally-symmetrical surfaces, in particular anamorphic aspherical surfaces, toric surfaces or biconical aspherical surfaces, are also described in WO 01/88597, which is hereby incorporated by reference. Some optical design programmes such as Oslo® and Code V® allow optical systems to be described and designed through mathematical functions, by which it is also possible to set non-rotationally-symmetrical optical surfaces. The aforementioned mathematical descriptions relate to mathematical surfaces. An actually optically used optical surface, i.e. the physical surface of an optical element, which surface is acted upon by an illumination beam and can be described with this type of mathematical description, generally contains only a portion of the actual mathematical surface, also known as the parent surface. The mathematical surface thus extends beyond the physical optically effective surface. In so far as an optical system can be described with the aid of a reference axis, some or all of the optically used surface portions may be arranged beyond this reference axis in such a way that the reference axis divides the mathematical surface, but not, however, the actual optically used portion of this mathematical surface.

Field planes arranged parallel to one another facilitate the integration of the imaging optical system into constructional surroundings. This advantage can be particularly significant when the imaging optical system is used in a scanning projection exposure installation, since the scan directions can then be guided parallel to one another.

A maximum angle of reflection of 25° (e.g., a maximum angle of reflection of 20°, a maximum angle of reflection of 16°) can allow the imaging optical system to be used in a highly effective manner as a projection optical system for an EUV projection exposure installation, since the mirrors, over the entire aperture, i.e. the entire usable reflective surface, thereof, may then be covered with consistently highly reflective layers. This advantage can be important in particular for the p-polarisation components of reflected radiation, since the reflectivity of p-polarisation components decreases rapidly in the case of elevated angles of reflection.

An imaging optical system, wherein the quotient of a maximum angle of reflection of the imaging light within the imaging optical system and the numerical aperture thereof on the image side is at most 40°, can allow a good compromise to be achieved between high EUV throughput and optimised pattern resolution in an EUV projection exposure installation.

A mirror arranged before the last mirror in the imaging light path in the region of a pupil plane and having a convex basic shape allows good Petzval correction of the imaging optical system to be achieved.

An imaging optical system having at least four mirrors (e.g., six mirrors) can be particularly suitable for the construction of an imaging optical system that is both compact and well-corrected in terms of its imaging errors.

Imaging optical systems having mirrors with angular magnification of the principal ray, wherein at least two of the mirrors have a negative angular magnification of the principal ray, and wherein a mirror with positive angular magnification of the principle ray is arranged between two mirrors with negative angular magnification of the principal ray, can allow systems with low maximum angles of reflection to be achieved. Imaging optical systems with three mirrors and a negative angular magnification of the principal ray are also possible. The angular magnification of the principal ray is defined as the angle between a principal ray belonging to a central field point and a reference axis. The reference axis is perpendicular to the object plane of the projection exposure installation and extends through the centre point of the object field.

A beam angle of a central imaging beam, directed through the last mirror and essentially through a pupil, of a central object point of greater than 85° relative to the image plane produces merely a low lateral image shift in the image plane when defocusing.

An imaging optical system, wherein the imaging light path directed through the last mirror has an intermediate image being arranged in an intermediate image plane in the region of the through-hole in the mirror, a portion of the optical system between the object plane and the intermediate image plane having a reducing magnification level of at least 2× can allow a relatively large penultimate mirror in the light path before the image field to be used. This can reduce the maximum angle of reflection and can also reduce the extent of pupil obscuration if the penultimate mirror is obscured. It is also possible to achieve magnification of the portion of the optical system of greater than 2× (e.g., greater than 2.5×, greater than 3.0×, 3.2×).

An arrangement, wherein a mirror, which is arranged so as to be the penultimate mirror in the imaging light path, has a through-hole for imaging light to pass through, the image plane being arranged behind the penultimate mirror so as to be off-centre by not more than a fifth of the diameter of the penultimate mirror (e.g., to be central) relative to the penultimate mirror, can allow a penultimate mirror with a relatively small through-hole to be used. This can ensure a stable penultimate mirror and low pupil obscuration.

A slightly curved penultimate mirror having a radius of curature greater than 500 mm (e.g., greater than 1,000 mm, greater than 1,500 mm) can allow a small through-hole relative to the diameter of the mirror to be achieved in the penultimate mirror at a given image-side numerical aperture.

An image field greater than 1 $mm^2$ can lead to good throughput when the imaging optical system is used in a projection exposure installation.

An image-side numerical aperture on the image side of at least 0.4 (e.g., at least 0.45, at least 0.5, at least 0.55, at least 0.6, at least 0.65, at least 0.7) can allow high resolution of the imaging optical system to be achieved.

An image-side telecentric imaging optical system can allow, for example, the system to refocus in the image plane without thereby changing the imaging magnification and thus can increase the flexibility of use of the imaging optical system. On the object-side, the imaging optical system can be formed in such a way that individual rays which are associated with different object field points but with the same exposure direction, enter the imaging optical system from the object field in a convergent manner. Alternatively, it is also possible for the individual rays of this type to enter the imaging optical system in a divergent or parallel manner. The latter case results in an object-side telecentric imaging optical system.

A low object-image shift of less than 100 mm (e.g., less than 10 mm, less than 1 mm) can lead to a compact imaging optical system and, in addition, facilitates optical system test methods, in which the imaging optical system is rotated about an axis extending through the object or image field and located perpendicular to the corresponding field plane, since the object or image field then does not shift too far during rotation.

At least one pair of adjacent mirrors, wherein the mirrors are at a distance from one another, perpendicular to the object plane and/or to the image plane, of more than 40% of the distance between the object field and the image field, can allow small angles of incidence to be observed in the light path of the imaging light through the imaging optical system. Due to the small angles of incidence, it is also possible to achieve highly reflective mirrors in the EUV wavelength range. In particular, 2, 3, 4 or more pairs of mirrors may satisfy the distance condition.

Having in the imaging optical system at least one mirror with a minimum distance of less than 25 mm from the reflection surface used to the closest imaging light path not acting upon the mirror results in an imaging optical system in which the angle of incidence on the mirrors is kept as small as possible. The advantages of small angles of incidence on mirrors has previously been discussed. In particular 2, 3 or 4 mirrors of the imaging optical system may be at the minimum distance. This minimum distance can be less than 25 mm, but optionally greater than 5 mm so the constructional demands on the mirrors are not too great.

An imaging optical system, wherein the imaging light is reflected to the image field by the mirror including the through-hole for the imaging light to pass through, in which the last mirror in the imaging light path includes the through-hole, can allow a high numerical aperture to be achieved in a compact construction with minimised imaging errors.

The advantages of a projection exposure installation including an imaging optical system, including a light source for the illumination and imaging light, and including a lens system for directing the illumination light to the object field of the imaging optical system, and wherein the light source for generating the illumination light is formed with a wavelength of between 10 and 30 mm, can correspond to those previously discussed with regard to the imaging optical system. The light source of the projection exposure installation may be in the form of a broadband light source and may have, for example, a bandwidth greater than 1 nm (e.g., greater than 10 nm, greater than 100 nm). In addition, the projection exposure installation may be constructed in such a way that it can be operated with light sources of different wavelengths.

Corresponding advantages can also apply to the production method including the steps of providing a reticle and a wafer, projecting a structure on the reticle onto a light-sensitive layer of the wafer by using the projection exposure installation and producing a microstructure on the wafer, and the microstructured component produced thereby.

Using the imaging optical system as a microlens, wherein the arrangement of the optical components when used in this way correspond to those on the condition that object plane and image plane are exchanged, and when inspecting a substrate which is to be exposed or has already been exposed with respect to projection exposure with a lithographic projection exposure installation, can result in the advantage that, in the region of the intermediate image, drilling through any very small mirrors can be avoided.

Embodiments of the disclosure will be described in the following in greater detail with reference to the drawings.

DETAILED DESCRIPTION

Figure 1:
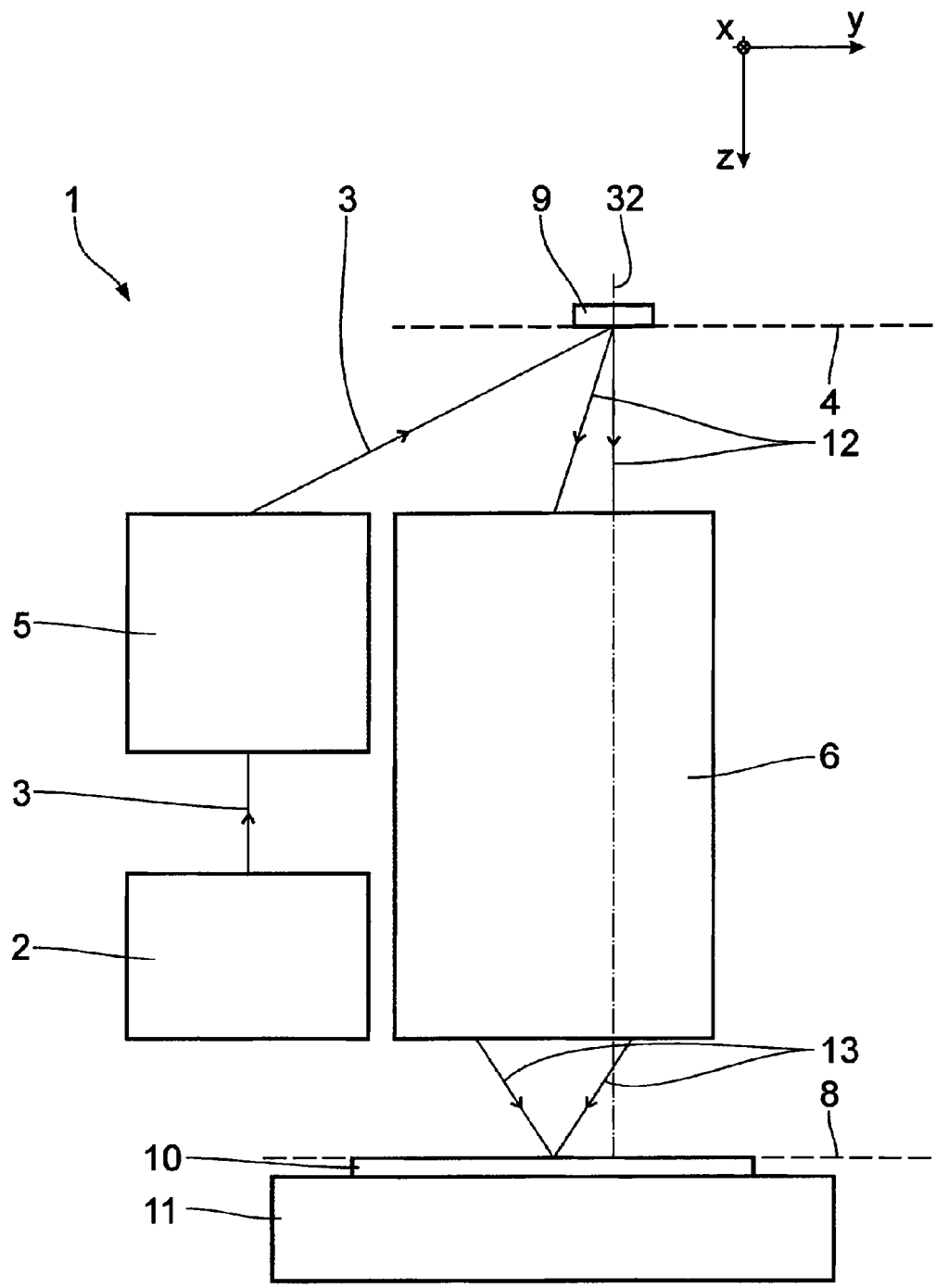
FIG. 1 schematically shows a projection exposure installation for microlithography.

Referring to FIG. 1, a projection exposure installation 1 for microlithography has a light source 2 for illumination light. The light source 2 is an EUV light source which produces light in a wavelength range of between 10 nm and 30 nm. Other EUV wavelengths are also possible. In general, even any desired wavelengths, for example visible wavelengths, are possible for the illumination light guided in the projection exposure installation 1. A light path of the illumination light 3 is very schematically shown in FIG. 1.

Figure 2:
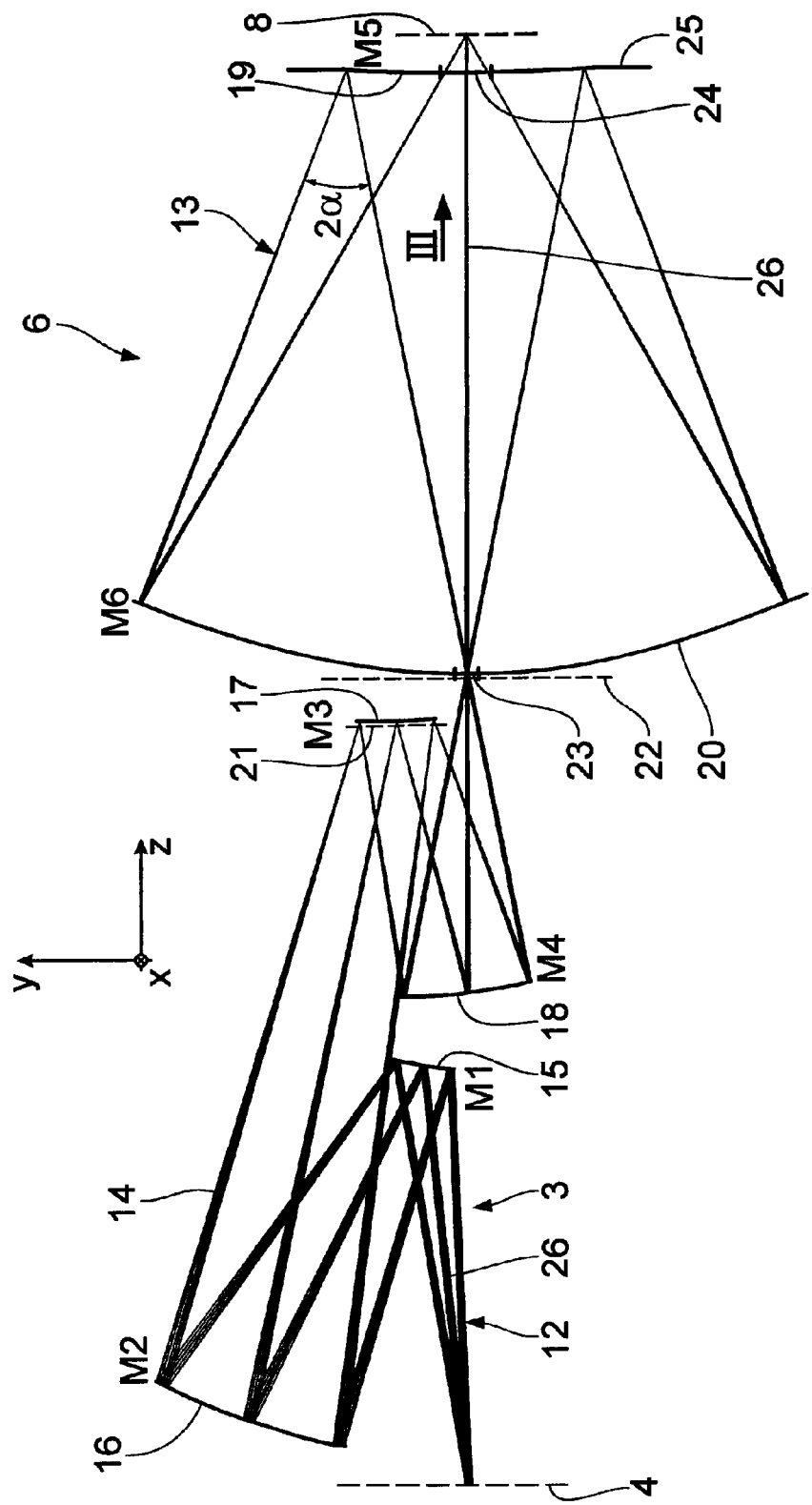
FIG. 2 shows a cross-section through a projection optical system of the projection exposure installation in FIG. 1 containing field points spaced from one another along an imaging light path.

A lens system 5 serves to guide the illumination light 3 to an object field in an object plane 4. The object field is imaged by a projection optical system 6 in an image field 7 (cf. FIG. 3) in an image plane 8 with a predetermined reduction scale. The projection optical system 6 reduces the size by a factor of 8. Other imaging magnification levels are also possible, for example 4×, 5×, 6× or even imaging magnification levels greater than 8×. An imaging magnification level of 8× is particularly suitable for illumination light with an EUV wavelength, since the object-side angle of incidence on a reflection mask can thereby remain small. An image-side aperture of the projection optical system of NA=0.5 produces an illumination angle of less than 6° on the object-side. An image magnification level of 8× does not require, in addition, unnecessarily large masks to be used. In the projection optical system 6 according to FIG. 2, the image plane 8 is arranged parallel to the object plane 4. A portion of a reflective mask 9, also known as a reticle, coinciding with the object field is hereby imaged. Imaging is achieved on the surface of a substrate 10 in the form of a wafer which is supported by a substrate holder 11. In FIG. 1, a light beam 12 of the illumination light 3 entering the projection optical system 6 is shown schematically between the reticle 9 and the projection optical system, and a ray beam 13 of the illumination light 3 exiting from the projection optical system 6 is shown schematically between the projection optical system 6 and the substrate 10. The image field-side numerical aperture of the projection optical system 6 in accordance with FIG. 2 is 0.50. The projection optical system 6 is telecentric on the image side.

In order to aid the description of the projection exposure installation 1 an xyz Cartesian coordinate system is provided in the drawings and shows the respective locations of the components represented in the figures. In FIG. 1 the x direction extends perpendicularly into the drawing plane, the y direction extends to the right and the z direction extends downwards.

The projection exposure installation 1 is a scanner-type device. Both the reticle 9 and the substrate 10 are scanned in the y direction during operation of the projection exposure installation 1.

FIG. 2 shows the optical construction of the projection optical system 6. The light path of each of three individual rays 14, coming from five object field points which, in FIG. 2, are on top of one another and are at a distance from one another in the y direction, is shown, the three individual rays 14 which belong to one of the five object field points each being associated to three different illumination directions for the five object field points.

From object field 4, the individual rays 14 are initially reflected by a first mirror 15, which is denoted in the following as mirror M1, and are subsequently reflected by further mirrors 16, 17, 18, 19, 20, which are also denoted in the following as mirrors M2, M3, M4, M5 and M6 in the sequence of the light path. The projection optical system 6 in FIG. 2 therefore has 6 reflective mirrors. The mirrors have a coating which is highly reflective for the wavelength of the illumination light, if required due to the wavelength, for example with EUV wavelengths. Radiation of greatly differing wavelengths may also be guided in the lens system 5 and the projection optical system 6, since these optical systems have substantially achromatic properties. In these optical systems it is therefore possible, for example, to direct an adjusting laser or to operate an autofocusing system, at the same time using a wavelength for the illumination light that differs greatly from the operating wavelengths of the adjusting laser or the autofocusing system. An adjusting laser can thus operate at 632.8 nm, 248 nm or 193 nm, while, at the same time, an illumination light is operated in the range between 10 and 30 nm.

The mirrors 15, 17 and 19 have a convex basic shape and can thus be described by a convex best-fitted surface. The third mirror 17 in particular has a convex basic shape. The mirrors 16, 18 and 20 have a concave basic shape and can thus be described by a concave best-fitted surface. In the following description, this type of mirror is referred to in a simplified manner merely as convex or concave. The concave mirror 17 provides good Petzval correction in the projection optical system 6.

The individual rays 14, which come from spaced object field points and are associated with the same illumination direction, enter the projection optical system 6 in a convergent manner between the object plane 4 and the first mirror M1. The design of the projection optical system 6 can be adapted in such a way that the same illumination directions for the individual rays 14 associated with the object field points also extend in a divergent manner from, or in a parallel manner to, one another between these components. The latter variant corresponds to a telecentric light path on the object side.

The individual rays 14 belonging to a particular illumination direction of the five object field points 3 merge in a pupil plane 21 of the projection optical system 6, adjacent to which the mirror 17 is arranged. The mirror 17 is therefore also known as a pupil mirror. An aperture stop may be arranged in the pupil plane 21 for limiting the illumination light ray beam. The aperture stop may be provided by a mechanical and removable stop or in the form of an appropriate coating applied directly to the mirror M3.

The mirrors 15 to 18 image the object plane 4 in an intermediate image plane 22. The intermediate image-side numerical aperture of the projection optical system 6 is 0.2. The mirrors 15 to 18 form a first portion of the imaging optical system of the projection optical system 6 with a reducing magnification level of 3.2×. The following mirrors 19 and 20 form a further portion of the imaging optical system of the projection optical system 6 with a reducing magnification level of 2.5×. In the sixth mirror 20, in the region of the intermediate image plane 22, a through-hole 23 is formed, through which the illumination or imaging light 3 passes after reflection by the fourth mirror 18 towards the fifth mirror 19. In turn, the fifth mirror 19 has a central through-hole 24 through which the ray beam 13 passes between the sixth mirror 20 and the image field 8.

The fifth mirror 19, which, together with the sixth mirror 20, images the illumination or imaging light 3 from the intermediate image plane 22 in the image plane 8, is arranged in the vicinity of a further pupil plane 25, conjugate to the first pupil plane 21, of the projection optical system 6. The further pupil plane 25 is typically located in the light path of the imaging light 3 between the fifth mirror 19 and the sixth mirror 20, so there is a physically accessible stop plane at the location of the further pupil plane 25. An aperture stop can alternatively or additionally be arranged in this diaphragm plane, as previously described with respect to the aperture stop in the region of the pupil plane 21.

The projection optical system 6 has an obscuration stop arranged centrally in one of the pupil planes 20, 25. By this means the beam portions of the projection light path, associated with the central through-holes 23, 24 in the mirrors 20, 19, are obscured. The construction of the projection optical system 6 can therefore also be termed construction with central pupil obscuration.

A marked individual ray 14, which connects a central object field point to a centrally illuminated point in the entrance pupil of the projection optical system 6 in the entrance pupil plane 21, will also be referred to in the following as the principal ray 26 of a central field point. The principal ray 26 of the central field point makes approximately a right angle with the image plane 8 after reflection on the sixth mirror 20 and thus extends approximately parallel to the z-axis of the projection exposure installation 1. The angle is greater than 85° in any case.

Figure 3:
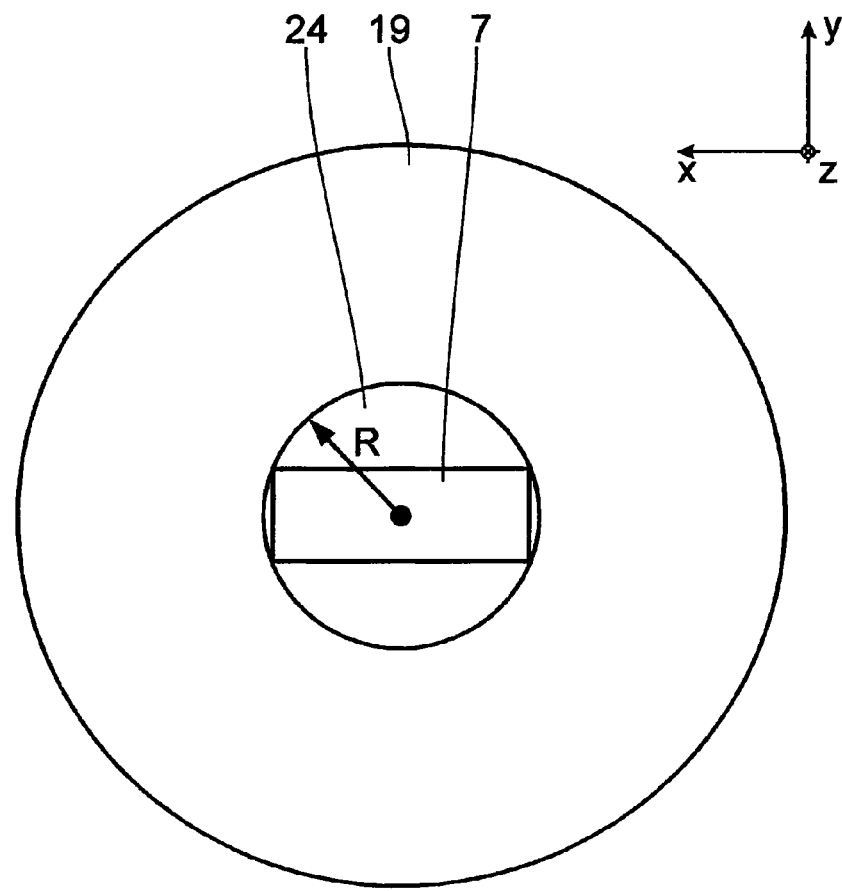
FIG. 3 shows a plan view of an image field of the projection optical system in FIG. 2 viewed from direction III in FIG. 2.

The image field 7 is rectangular. The aspect ratio of the image field 7 is not shown to scale in FIG. 3. The image field 7 extends by 13 mm parallel to the x direction. The image field 7 extends by 1 mm parallel to the y direction. The image field 7 is located centrally behind the fifth mirror 19, as shown in FIG. 3. A radius R of the through-hole 24 can be calculated from:

$$R = \frac{1}{2} \cdot D + d_w \cdot NA.$$

D is the diagonal of the image field 7. $d_w$ is the working distance of the mirror 19 from the image plane. NA is the numerical aperture on the image side.

All six mirrors 15 to 20 of the projection optical system 6 are in the form of free-form surfaces which cannot be described by a rotationally symmetrical function. Other configurations of the projection optical system 6 are also possible, in which at least one of the mirrors 15 to 20 includes a free-form reflection surface of this type.

Production of a free-form surface 27 of this type from a rotationally symmetrical reference surface 28 will be described in the following with reference to FIG. 4. First of all, information on the characterisation of the free-form surface under consideration is obtained. The reference surface 28 can, for example, be a rotationally symmetrical asphere. Part of the design information may be the radius of curvature of the reference surface 28, which is also referred to as 1/c, c denoting the vertex curvature of the reference surface 28. A conical constant k of the reference surface 28 and polynomial coefficients which describe the reference surface 28 are also part of the information.

Alternatively or additionally, the information characterising the reference surface 28 can also be obtained from a surface measurement of a reference mirror surface, for example, by using an interferometer. This type of surface measurement produces a function z'(x', y'), which describes the reference surface 28, z' denoting the rising height of the reference surface 28 along the z'-axis for different (x', y') coordinates, as shown in FIG. 4.

This first step in designing the free-form surface also includes determining the portion of the mirror surface, which is only defined by the surface description and is initially unlimited, that will actually be used for reflecting illumination or imaging light 3 during imaging of the object field in the image field 7. The region is also referred to as the footprint. The footprint of the mirror can be at least approximately determined by ray tracing of the projection optical system 6. Examples for a possible footprint in the x dimension are provided in FIG. 4. $x_{min}$ refers to the lower limit and $x_{max}$ refers to the upper limit for the exemplary footprint. The data above $x_{max}$ and below $x_{min}$ are similarly calculated within specific limits so that no undesired edge effects arise when determining the free-form surface 27.

After the information characterising the reference surface 28 has been determined, a local coordinate system for the reference surface 28 is introduced, in which both decentration and tilting of the reference surface 28 are zero. The z'-axis is thus the axis of rotational symmetry of the aspherical reference surface 28 or, if the reference surface was obtained by a surface measurement, the optical axis of the measuring device, for example the interferometer. The z'-axis is generally displaced parallel to and tilted relative to the z-axis of the xyz coordinate system of the projection exposure installation 1. This also applies to the other coordinate axes x', y'. This parallel displacement or tilting is determined in the initial step in the optical design of the free-form surface.

As an alternative to an asphere, the reference surface 28 may also be a spherical surface. The origin of the coordinates $x_c$, $y_c$, $z_c$ for describing the spherical reference surface 28 generally differs from the origin of the xyz coordinate system of the projection exposure installation 1.

After the reference surface 28 has been determined, a local distance $d_i$ (i=1 . . . N) between a number of points on the reference surface 28 and points on the free-form surface 27 parallel to the z'-axis is determined. The different local distances $d_i$ are then varied until a set of secondary conditions is satisfied. The secondary conditions are predetermined limit values for specific imaging errors and/or illumination properties of the projection optical system 6.

The free form surface can be mathematically described by the following equation:

$$Z = \frac{cr^2}{1 + \sqrt{1 - (1+k)c^2 r^2}} + \sum_{j=2}^{66} C_j X^m Y^n$$

in which:

$$j = \frac{(m+n)^2 + m + 3n}{2} + 1$$

Figure 4:
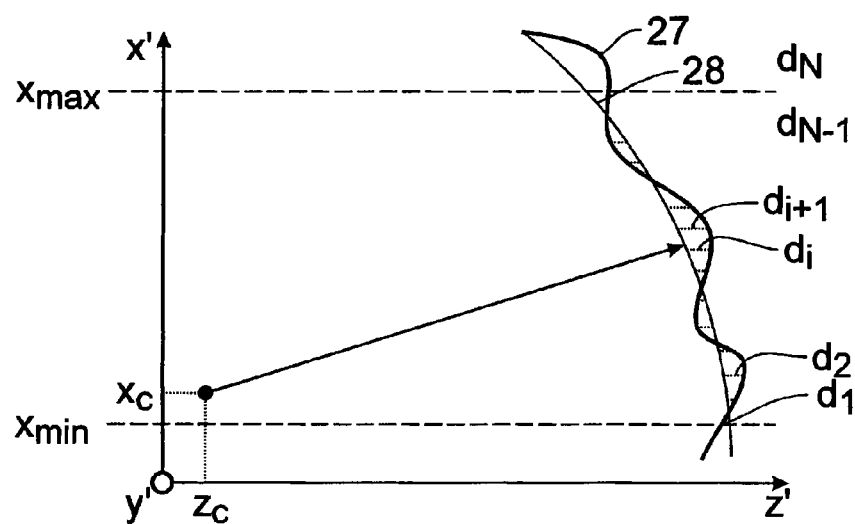
FIG. 4 shows a cross-section through a non-rotationally-symmetrical free-form surface and through a rotationally symmetrical surface.

Z is the rising height of the free-form surface parallel to a Z-axis which can, for example be parallel to the z'-axis in FIG. 4.

c is a constant corresponding to the vertex curvature of a corresponding asphere. k corresponds to a conical constant of a corresponding asphere. $C_j$ are the coefficients of the monomials $X^m Y^n$. The values of c, k and $C_j$ are generally determined on the basis of the desired optical properties of the mirror inside the projection optical system 6. The order of the monomial, m+n, can be varied as desired. A monomial of a higher order can lead to a design of the projection optical system with improved image error correction, but is, however, more complex to calculate. m+n can have values of between 3 and more than 20.

Free-form surfaces can also be described mathematically by Zernike polynomials, which are described, for example, in the manual of the optical design program CODE V®. Alternatively, free-form surfaces can be described with two-dimensional spline surfaces. Examples thereof are Bezier curves or non-uniform rational basis splines (NURBS). Two-dimensional spline surfaces can be described, for example, by a grid of points in an xy-plane and related z-values, or by the points and their related gradients. Depending on the respective type of spline surface, the complete surface will be obtained by interpolating between the grid points by using, for example, polynomials or functions which have specific properties with respect to their continuity and differentiability. Examples thereof include analytical functions.

The mirrors 15 to 20 have multiple reflective coatings for optimising the reflection thereof for the incident EUV illumination light 3. Reflection is better the closer the angle of incidence of the individual rays 14 on the mirror surface is to the perpendicular incidence. The projection optical system 6 has very small angles of reflection for all of the individual rays 14. Half of the angle between the individual ray 14 striking a point on one of the mirrors 15 to 20 and the individual ray 14 reflected from this point will be referred to in the following as the angle of reflection of this point.

The maximum angle of reflection in the projection optical system 6 is the angle of the individual ray 14 at the outer edge of the fifth mirror 19. This angle α is approximately 16° in the projection optical system 6. The quotient of the maximum angle of reflection a and the numerical aperture is thus 32° in the projection optical system 6 shown in FIG. 2.

Figure 5:
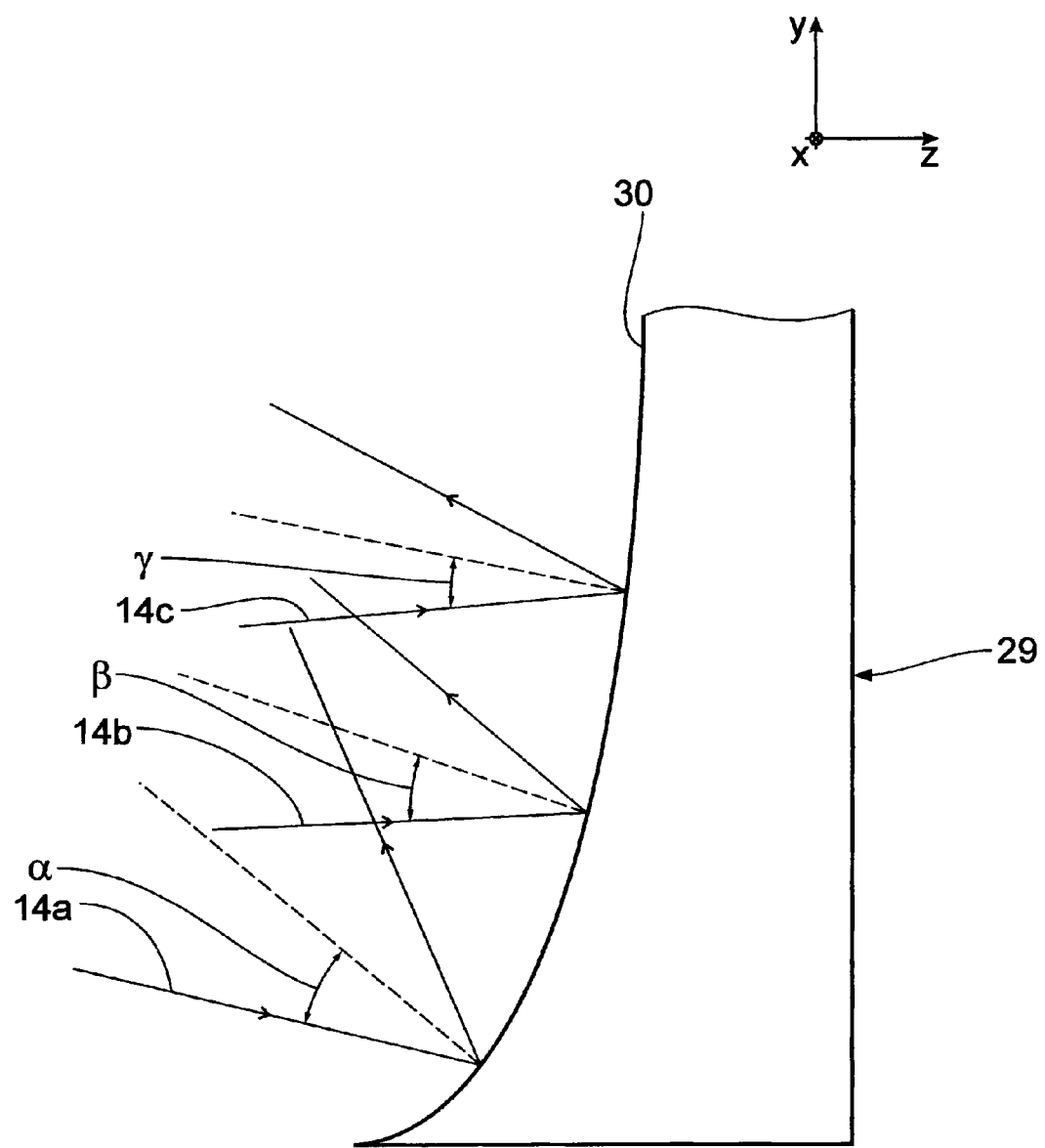
FIG. 5 shows a cross-section through a portion of a mirror of the projection optical system in FIG. 2.

The dependence of the size of the angle of reflection on the position of the point of incidence on the reflection mirror will be explained schematically in the following with an example of a sample reflection mirror 29, shown in FIG. 5. In the picture a divergent beam of individual rays 14a, 14b, 14c strikes a reflection surface 30 of the sample reflection mirror 29. The reflection surface 30 is convex. Due to the collective effect of the reflection surface 30, the incident descending beam made of individual rays 14a, 14b and 14c is deflected forming a reflected convergent beam. The individual ray 14a striking closest to the edge on the reflection surface 30 is deflected with the largest angle of reflection α, the centre individual ray 14b is deflected with an angle of reflection β which is smaller in comparison thereto and the individual ray 14c furthest from the edge of the sample reflection mirror 29 is deflected by the smallest angle of reflection y.

Figure 6:
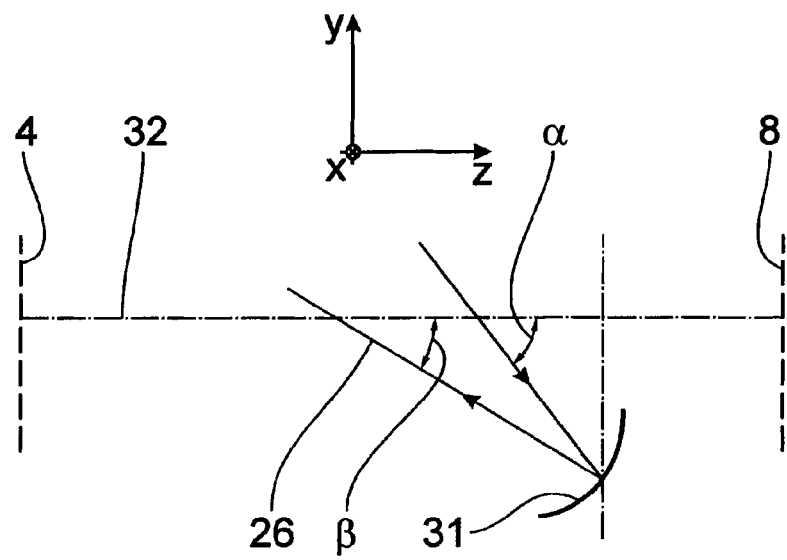
FIG. 6 schematically shows a light path onto a mirror in the projection optical system in FIG. 2 with positive angular magnification of the principal ray.

The light path within the projection optical system 6 can additionally be characterised by the sequence of angular magnification of the principal ray. This will be explained in the following with reference to the schematic drawings 6 and 7. In FIG. 6, the principal ray 26 is radiated onto a sample reflection mirror 31 at an angle α to a reference axis 32 extending perpendicular to the object plane 4 of the projection exposure installation 1. On the side of the object field, i.e. up to and inclusive of the mirror M4, the reference axis 32 is additionally defined by the centre of the object field. The reference axis 32 generally does not coincide with the z-axis but runs parallel to the axis. After being reflected by the sample reflection mirror 31, the principal ray 26 is reflected back at an angle β to the reference axis 32. Since both angles α, β are between 0 and 90°, the quotient tan α/tan β is positive. The sample reflection mirror 31 therefore has a positive angular magnification of the principal ray.

Figure 7:
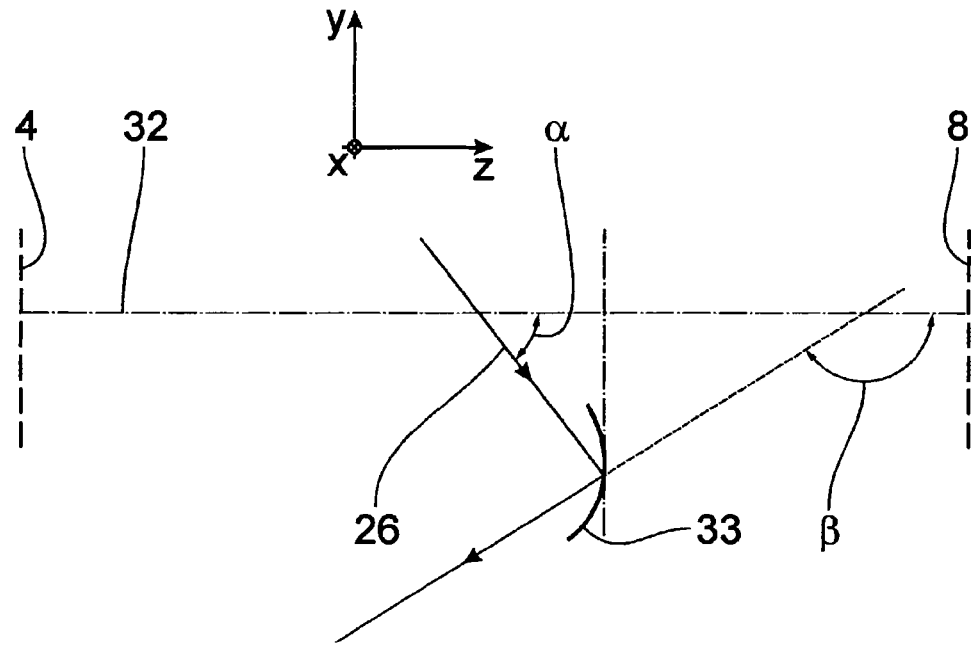
FIG. 7 schematically shows a light path onto a mirror in the projection optical system in FIG. 2 with a negative angular magnification of the principal ray.

FIG. 7 shows the case of negative angular magnification of the principal ray. The incident principal ray 26 intersects the reference axis 32 at an angle α which is between 0 and 90°. The principal ray 26 reflected by a sample reflection mirror 33 virtually encloses an angle β between 90 and 180° with the reference axis 32. In this case the quotient tan α/tan β is thus negative.

In the projection optical system 6, the first mirror 15 has negative angular magnification of the principal ray. The second mirror 16 has positive angular magnification of the principal ray. The third mirror 17 has negative angular magnification of the principal ray. The angular magnification of the fourth mirror 18 is infinite, since the angle β is 180° at that location.

Figure 8:
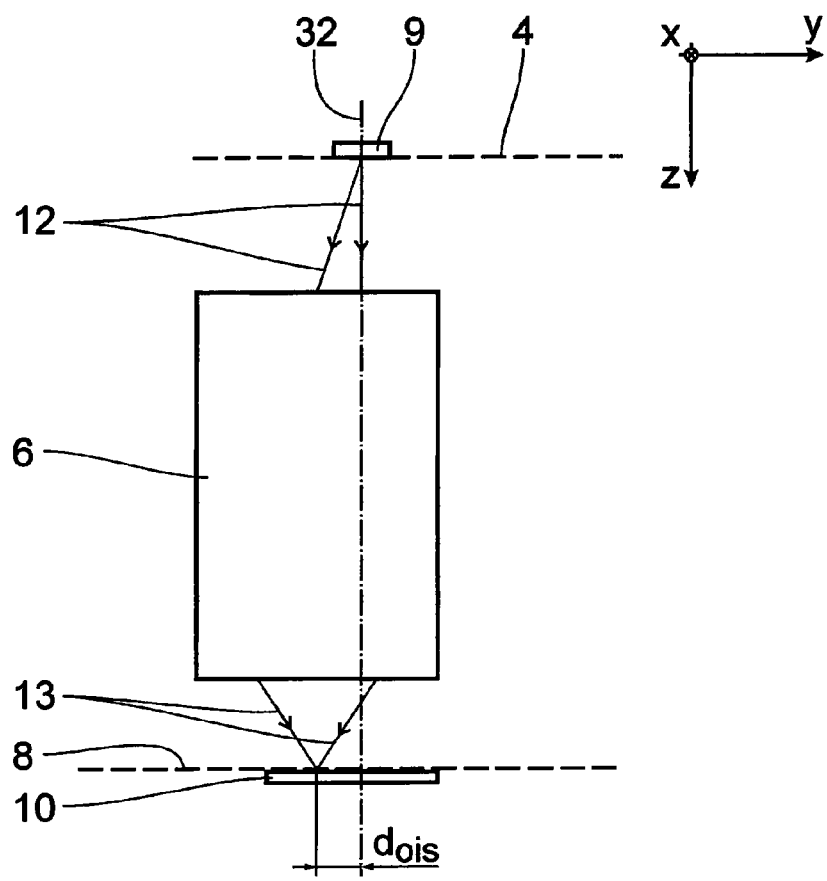
FIG. 8 shows a similar view to FIG. 1 of a projection exposure installation for microlithography.

FIG. 8 again shows a slightly modified representation of the projection exposure installation 1 for clearly showing a further characterising value of the projection optical system 6, namely the object-image shift $d_{ois}$. This is defined as the distance between a perpendicular projection of the central object point onto the image plane 8 and the central image point. In the projection optical system 6 shown in FIG. 2, the object-image shift $d_{ois}$ is less than 1 mm.

Figure 9:
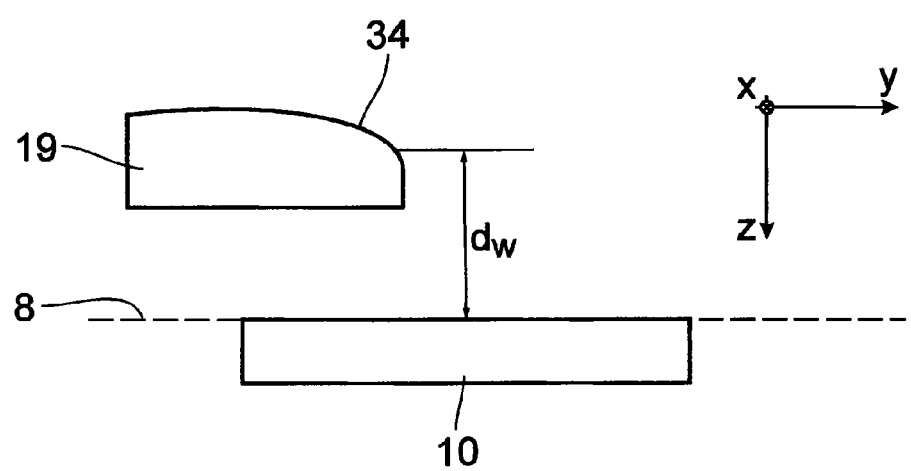
FIG. 9 shows an enlarged partial detail of a wafer exposed with the projection exposure installation in FIG. 1 or 8, and a mirror adjacent thereto.

FIG. 9 demonstrates a further characteristic of the projection optical system 6, namely the free working distance $d_w$. This is defined as the distance between the image plane 8 and the closest portion 34 thereto of one of the mirrors of the projection optical system 6, i.e. mirror 19 in the embodiment shown in FIG. 2.

In the projection optical system 6, the free working distance $d_w$ is 40 mm. The fifth mirror 19, which is closest to the image plane 8, can therefore be constructed having a thickness that provides sufficient stability of the fifth mirror 19. Materials for mirrors of this type include, for example, quartz, zerodur or silicon carbide compounds. Other materials with ultra low expansion properties may also be used. Examples of materials of this type are known from products sold by Corning, USA, under the name "ULE".

The optical data of the projection optical system 6 are summarised in the following:

The image-side numerical aperture NA is 0.5. The size of the image field is 1×13 mm². The reducing magnification level is 8×. The image field 7 is rectangular. The wavelength of the illumination light is 13.5 nm. The sequence of the optical effects of the mirrors M1 to M6 (negative N; positive P) is NPNPNP. Principal rays enter the projection optical system in a convergent manner from the object plane. An aperture stop is arranged on the mirror M3 for limiting the illumination light at the edge. The z-distance between the object plane 4 and the image plane 8 is 1,500 mm. The object-image shift is 0.42 mm. 5.9% of the illuminated surfaces in the pupil planes are obscured. The projection optical system has a wave front error (rms) of 0.02 in units of the wavelength of the illumination light 3. The distortion is 12 nm. The field curvature is 9 nm. The angle of the principal ray at the central object field point is 5.9°. The mirror M1 has dimensions (x/y) of 117×61 mm². The mirror M2 has dimensions of 306×143 mm². The mirror M3 has dimensions of 80×77 mm². The mirror M4 has dimensions of 174×126 mm². The mirror M5 has dimensions of 253×245 mm². The mirror M6 has dimensions of 676×666 mm². The sequence of the principal ray angle of incidence, of the principal ray 26 of the central object field point, on the mirrors M1 to M6 is 16.01°, 7.14° 13.13°, 7.21°, 0.0° and 0.0°. The sequence of the maximum angle of incidence on the mirrors M1 to M6 is 22.55°, 9.62°, 13.90°, 10.16°, 16.23°, 4.37°. The sequence of bandwidths of the angle of incidence on the mirrors M1 to M6 is 13.12°, 5.07°, 1.58°, 6.10°, less than 16.23° and less than 4.37°. The working distance in the object plane 4 is 100 mm. The working distance in the image plane 8 is 40 mm. The ratio of the distance between the object plane 4 and the mirror M1 and the distance between the object plane 4 and the mirror M2 is 4.25. Between each of the adjacent mirrors M2-M3, M4-M5, M5-M6 and also between the mirror M6 and the image plane 8 there is a distance of greater than 40% of the z-distance between the object plane 4 and the image plane 8. The mirrors M1 and M4 have a minimum distance from the used reflection surface to the closest imaging light path not acting on the mirror (free board) of less than 25 mm.

The optical design data of the reflection surfaces of the mirrors M1 to M6 of the projection optical system 6 can be gathered from the following tables. The first of the tables shows the respective reciprocal value of the vertex curvature (radius) and a distance value (thickness), which corresponds to the z-distance of adjacent elements in the light path, starting from the object plane, for the optical components and the aperture stop. The second table shows the coefficients $C_j$ of the monomials $X^m Y^n$ in the aforementioned free-form surface equation for the mirrors M1 to M6. At the end of the second table the value by which the respective mirror is decentred (Y-decenter) and rotated (X-rotation) from a mirror reference design is given in millimeters. This corresponds to the parallel displacement and tilting in the free-form surface design method described above. Displacement thus takes place in the y direction and tilting takes place about the x axis. The angle of rotation is given in degrees.

| Surface | Radius | Thickness | Mode |
|---|---|---|---|
| Object | INFINITY | 425.420 | |
| Mirror 1 | 294.947 | −325.420 | REFL |
| Mirror 2 | 681.039 | 690.757 | REFL |
| Mirror 3 | 319.431 | 0.000 | REFL |
| STOP | INFINITY | −244.337 | |
| Mirror 4 | 396.876 | 913.580 | REFL |
| Mirror 5 | 1749.322 | −620.710 | REFL |
| Mirror 6 | 834.214 | 660.710 | REFL |
| Image | INFINITY | 0.000 | |

| Coefficient | M1 | M2 | M3 | M4 | M5 | M6 |
|---|---|---|---|---|---|---|
| K | −8.972907E−01 | −2.722153E−01 | 6.009025E+00 | −2.083103E−01 | 3.438760E+01 | 3.027724E−01 |
| Y | 0.000000E+00 | 0.000000E+00 | 0.000000E+00 | 0.000000E+00 | 0.000000E+00 | 0.000000E+00 |
| X2 | −6.723739E−04 | −9.397624E−05 | −5.616960E−04 | −1.596929E−04 | 9.008585E−06 | 3.436254E−05 |
| Y2 | −7.259542E−04 | −1.245430E−04 | −4.962660E−04 | −1.209634E−04 | 2.711820E−06 | 3.328586E−05 |
| X2Y | −2.611787E−07 | 9.438147E−09 | −6.471824E−07 | −1.397345E−07 | −3.166886E−08 | 4.403654E−10 |
| Y3 | 1.848873E−07 | 2.540415E−08 | 4.939085E−07 | −1.842875E−07 | 5.311486E−09 | 6.726500E−10 |
| X4 | −5.585253E−10 | −3.707750E−11 | −2.414232E−08 | −1.057114E−10 | 9.436063E−10 | 1.898115E−12 |
| X2Y2 | −1.454988E−09 | −1.447610E−10 | −4.434814E−08 | −5.420267E−11 | 1.946694E−09 | 4.974829E−12 |
| Y4 | −5.523329E−09 | −2.392090E−11 | −1.815299E−08 | 4.380159E−10 | 9.997897E−10 | 3.488151E−12 |
| X4Y | −1.364069E−12 | 1.084325E−15 | −3.114225E−11 | −1.197000E−12 | 5.182403E−14 | 4.428526E−16 |
| X2Y3 | 6.732062E−12 | 1.382697E−13 | 9.802932E−11 | −1.950774E−12 | 4.779360E−13 | 1.769320E−16 |
| Y5 | 3.635430E−11 | 0.000000E+00 | 7.767198E−11 | −1.559300E−12 | 3.401358E−13 | 4.373202E−16 |
| X6 | −2.750390E−15 | −9.087823E−17 | −9.415776E−13 | −4.463189E−16 | 1.620585E−15 | 9.932173E−19 |
| X4Y2 | 2.324635E−14 | −5.352295E−17 | −3.094331E−12 | 7.684993E−15 | 5.526453E−15 | 3.332327E−18 |
| X2Y4 | 3.956161E−15 | −2.030722E−16 | −3.217471E−12 | 3.107748E−15 | 5.847027E−15 | 3.759258E−18 |
| Y6 | −1.092384E−13 | −8.567898E−17 | −7.281446E−13 | −7.204126E−16 | 1.552120E−15 | 1.038153E−18 |
| X6Y | −1.179589E−16 | 4.377060E−19 | −1.789065E−16 | −1.451963E−19 | 3.245847E−19 | 1.324484E−22 |
| X4Y3 | −2.570887E−16 | 0.000000E+00 | 1.023466E−14 | −4.269245E−17 | 1.564405E−18 | −9.051915E−22 |
| X2Y5 | −8.917936E−17 | 7.695621E−21 | 1.492914E−14 | −1.217398E−17 | 2.326082E−18 | −1.811267E−22 |
| Y7 | 1.236168E−16 | 0.000000E+00 | 4.771084E−15 | 5.163018E−18 | 7.533041E−19 | 2.904675E−22 |
| X8 | 7.305784E−20 | −2.087892E−22 | −4.992347E−17 | −9.852110E−22 | 5.510114E−21 | −9.878544E−26 |
| X6Y2 | 6.107242E−19 | −8.775175E−22 | −2.298856E−16 | −2.713369E−20 | 2.453885E−20 | 6.254655E−25 |
| X4Y4 | 5.443174E−19 | −2.629666E−22 | −3.296922E−16 | 3.809184E−20 | 3.817638E−20 | 4.270350E−24 |
| X2Y6 | −6.091249E−19 | −8.692919E−23 | −1.689920E−16 | 3.730606E−21 | 2.483560E−20 | 4.657493E−24 |
| Y8 | −2.536724E−19 | 8.059798E−24 | −2.318537E−17 | −7.839829E−21 | 6.692413E−21 | 1.504196E−24 |
| X8Y | 0.000000E+00 | 0.000000E+00 | 0.000000E+00 | 0.000000E+00 | 0.000000E+00 | 0.000000E+00 |
| X6Y3 | 0.000000E+00 | 0.000000E+00 | 0.000000E+00 | 0.000000E+00 | 0.000000E+00 | 0.000000E+00 |
| X4Y5 | 0.000000E+00 | 0.000000E+00 | 0.000000E+00 | 0.000000E+00 | 0.000000E+00 | 0.000000E+00 |
| X2Y7 | 0.000000E+00 | 0.000000E+00 | 0.000000E+00 | 0.000000E+00 | 0.000000E+00 | 0.000000E+00 |
| Y9 | 0.000000E+00 | 0.000000E+00 | 0.000000E+00 | 0.000000E+00 | 0.000000E+00 | 0.000000E+00 |
| X10 | 0.000000E+00 | 0.000000E+00 | 0.000000E+00 | 0.000000E+00 | 0.000000E+00 | 0.000000E+00 |
| X8Y2 | 0.000000E+00 | 0.000000E+00 | 0.000000E+00 | 0.000000E+00 | 0.000000E+00 | 0.000000E+00 |
| X6Y4 | 0.000000E+00 | 0.000000E+00 | 0.000000E+00 | 0.000000E+00 | 0.000000E+00 | 0.000000E+00 |
| X4Y6 | 0.000000E+00 | 0.000000E+00 | 0.000000E+00 | 0.000000E+00 | 0.000000E+00 | 0.000000E+00 |
| X2Y8 | 0.000000E+00 | 0.000000E+00 | 0.000000E+00 | 0.000000E+00 | 0.000000E+00 | 0.000000E+00 |
| Y10 | 0.000000E+00 | 0.000000E+00 | 0.000000E+00 | 0.000000E+00 | 0.000000E+00 | 0.000000E+00 |
| Nradius | 1.00E+00 | 1.00E+00 | 1.00E+00 | 1.00E+00 | 1.00E+00 | 1.00E+00 |
| Y-decenter | 68.139 | −264.855 | 176.907 | −28.983 | 101.914 | 97.590 |
| X-rotation | −1.258 | 25.000 | 1.304 | 25.000 | 0.098 | 0.498 |

Figure 10:
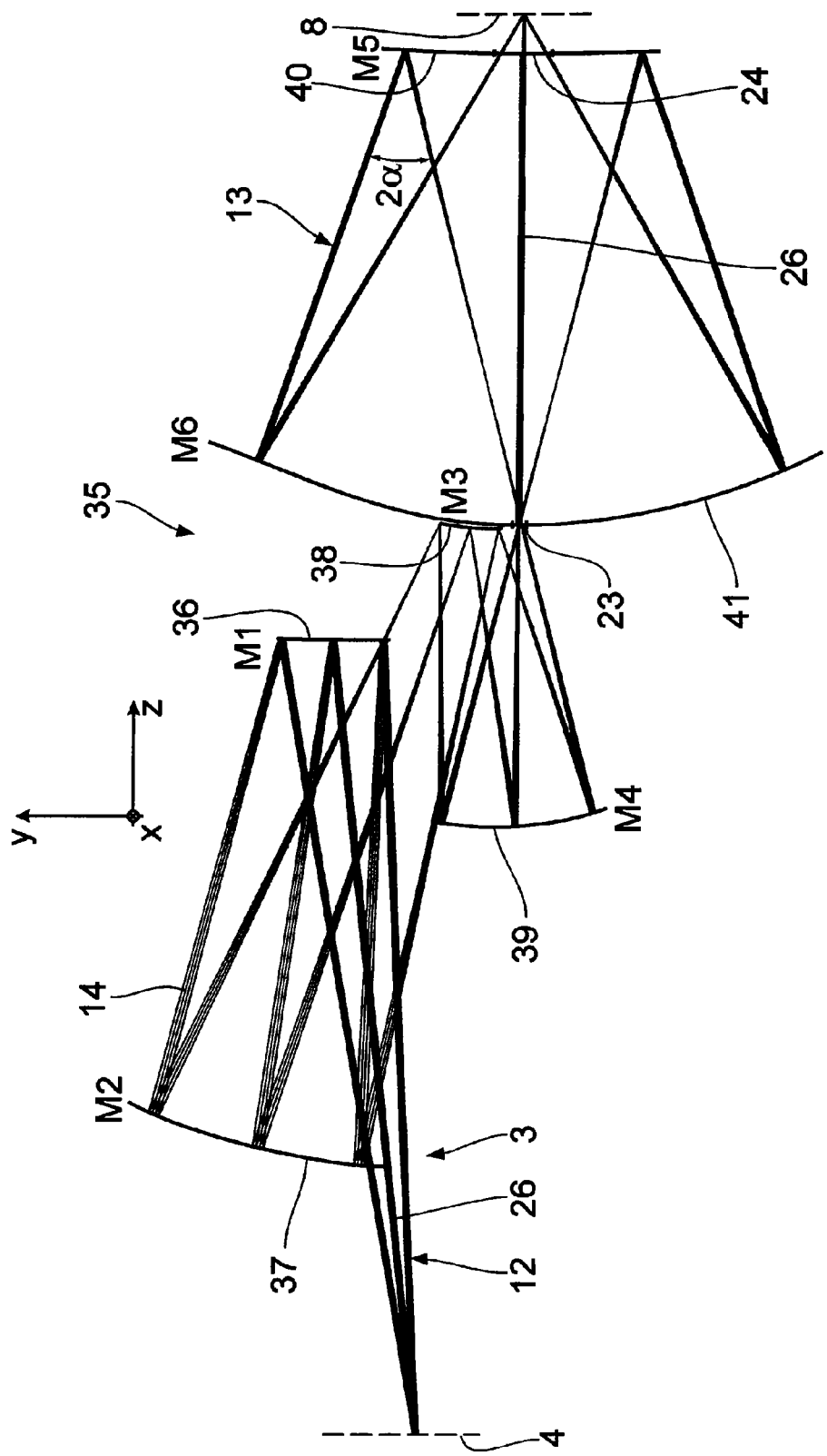
FIG. 10 shows a view similar to that of FIG. 2 of a projection optical system.

FIG. 10 shows a projection optical system 35, which can be used, instead of the projection optical system 6, in the projection exposure installation 1. Components or reference quantities which correspond to those which have previously been described with reference to FIGS. 1 to 9 have the same reference numerals and will not be discussed in detail again.

The projection optical system 35 also has a total of six reflective mirrors, which, starting from the object plane 4 in the light path sequence, have reference numerals 36 to 41, and will also be referred to in the following as mirrors M1 to M6. The mirrors 36 to 41 all have reflective free-form surfaces which cannot be described by a rotationally symmetrical function. The mirrors 36, 38 and 40 have a convex basic shape and the mirrors 37, 39, 41 have a concave basic shape.

The projection optical system 35 has a reduction factor of 8. The projection optical system 36 has an image-side numerical aperture of 0.5. The dimensions of the image field 7 of the projection optical system 35 are exactly the same as those of the projection optical system 6. The intermediate image-side numerical aperture is 0.28.

The first mirror 36 has negative angular magnification of the principal ray. The second mirror 37 has positive angular magnification of the principal ray. The third mirror 38 has negative angular magnification of the principal ray. The fourth mirror 39 has infinite angular magnification of the principal ray since the principal ray 26 extends from the fourth mirror 39 so as to be perpendicular to the image plane 8.

In the projection optical system 35, the object-image shift is markedly greater than in the projection optical system 6 and is 134 mm.

The maximum angle of reflection a, which is also achieved by the rays at the edge of the fifth mirror 40 in the projection optical system 35, is 17°. The quotient of the maximum angle of reflection α and the image-side numerical aperture is 34°.

At 42 mm, the free working distance $d_w$ in the projection optical system 35 is comparable with the free working distance of the projection optical system 6.

The optical data of the projection optical system 35 are summarised again in the following:

The image-side numerical aperture NA is 0.5. The dimensions of the image field 7 are 1×13 mm². The reducing magnification level is 8×. The image field 7 is rectangular. The wavelength of the illumination light 3 is 13.5 nm. The sequence of the optical effects of the mirrors M1 to M6 (negative N; positive P) is PPNPNP. At the image-side, the projection optical system 35 is virtually telecentric. An aperture stop for limiting the illumination light at the edge is arranged on mirror M3. The z-distance between the object plane 4 and the image plane 8 is 1,823 mm. The object-image shift is 134 mm. 9.2% of the surfaces illuminated in the pupil planes are obscured. The angle of the principal ray at the central object field point is 6°. The mirror M1 has dimensions (x/y) of 241×138 mm². The mirror M2 has dimensions of 377×269 mm². The mirror M3 has dimensions of 80×75 mm². The mirror M4 has dimensions of 246×197 mm². The mirror M5 has dimensions of 352×304 mm². The mirror M6 has dimensions of 776×678 mm². The sequence of the angle of incidence of the principal ray of the central object field point on the mirrors M1 to M6 is 7.10°, 5.19°, 13.66°, 4.60°, 0.0° and 0.02°. The sequence of the maximum angle of incidence on the mirrors M1 to M6 is 12.23°, 5.53°, 15.43°, 7.33°, 16.98° and 5.51°. The sequence of the bandwidths of the angle of incidence on the mirrors M1 to M6 is 9.93°, 0.78°, 2.98°, 5.27°, less than 16.98° and less than 5.51°. The working distance in the object plane 4 is 336 mm. The working distance in the image plane 8 is 42 mm. The ratio of the distance between the object plane 4 and the mirror M1 and the distance between the object plane 4 and the mirror M2 is 3.04. The mirrors M1 to M4 have a minimum distance between the used reflection surface and the closest imaging light path which does not act upon the mirror (free board) of less than 25 mm. The distance between the object plane 4 and the mirror M1 and the distances between the pairs of mirrors M2-M3 and M4-M5 is greater than 40% of the distance between the object plane and the image plane.

The optical design data of the reflection surfaces of the mirrors M1 to M6 of the projection optical system 35 can be gathered from the following tables, which correspond to the tables for the projection optical system in accordance with FIG. 2.

| Surface | Radius | Thickness | Mode |
|---|---|---|---|
| Object | INFINITY | 1023.157 | |
| Mirror 1 | −50610.892 | −686.714 | REFL |
| Mirror 2 | 1171.238 | 828.471 | REFL |
| Mirror 3 | 318.004 | 0.000 | REFL |
| STOP | INFINITY | −378.086 | |
| Mirror 4 | 413.560 | 994.620 | REFL |
| Mirror 5 | 2997.146 | −612.464 | REFL |
| Mirror 6 | 817.300 | 654.356 | REFL |
| Image | INFINITY | 0.000 | |

| Coeff. | M1 | M2 | M3 | M4 | M5 | M6 |
|---|---|---|---|---|---|---|
| K | 4.156869E+03 | 4.620221E−02 | 9.990462E+00 | −9.081861E−03 | −2.372322E−01 | 6.789706E−03 |
| Y | 0.000000E+00 | 0.000000E+00 | 0.000000E+00 | 0.000000E+00 | 0.000000E+00 | 0.000000E+00 |
| X2 | 4.219939E−05 | −7.203705E−05 | −2.856541E−04 | −1.831594E−04 | −4.114605E−05 | 2.674563E−06 |
| Y2 | −2.952066E−04 | −8.835077E−05 | 1.576757E−04 | −1.812758E−04 | −3.733421E−05 | 7.346415E−06 |
| X2Y | −2.987815E−08 | 1.958263E−08 | 4.843132E−07 | −7.966262E−08 | −5.183892E−08 | −3.629397E−09 |
| Y3 | 5.768104E−07 | 8.430075E−08 | −7.326854E−08 | −9.457440E−08 | −2.814518E−08 | 9.209304E−11 |
| X4 | 2.110770E−10 | 2.081353E−11 | 1.569949E−08 | −3.236129E−10 | 3.542926E−11 | 1.915378E−12 |
| X2Y2 | 3.100857E−10 | −1.622544E−11 | 3.080477E−08 | −6.357050E−10 | 8.409285E−11 | 4.860251E−12 |
| Y4 | −2.322578E−10 | −4.348550E−11 | −9.859142E−09 | −1.882466E−10 | −2.084652E−11 | 6.490959E−14 |
| X4Y | 0.000000E+00 | −7.908907E−15 | 0.000000E+00 | 1.810068E−13 | 1.675236E−13 | −2.002515E−15 |
| X2Y3 | 0.000000E+00 | 1.426458E−14 | 0.000000E+00 | −2.244745E−13 | 1.806451E−13 | −1.799322E−15 |
| Y5 | 0.000000E+00 | −1.321548E−14 | 0.000000E+00 | −2.730307E−13 | −1.337121E−14 | 3.920622E−16 |
| X6 | 0.000000E+00 | 0.000000E+00 | 0.000000E+00 | 0.000000E+00 | 0.000000E+00 | 0.000000E+00 |
| X4Y2 | 0.000000E+00 | 0.000000E+00 | 0.000000E+00 | 0.000000E+00 | 0.000000E+00 | 0.000000E+00 |
| X2Y4 | 0.000000E+00 | 0.000000E+00 | 0.000000E+00 | 0.000000E+00 | 0.000000E+00 | 0.000000E+00 |
| Y6 | 0.000000E+00 | 0.000000E+00 | 0.000000E+00 | 0.000000E+00 | 0.000000E+00 | 0.000000E+00 |
| X6Y | 0.000000E+00 | 0.000000E+00 | 0.000000E+00 | 0.000000E+00 | 0.000000E+00 | 0.000000E+00 |
| X4Y3 | 0.000000E+00 | 0.000000E+00 | 0.000000E+00 | 0.000000E+00 | 0.000000E+00 | 0.000000E+00 |
| X2Y5 | 0.000000E+00 | 0.000000E+00 | 0.000000E+00 | 0.000000E+00 | 0.000000E+00 | 0.000000E+00 |
| Y7 | 0.000000E+00 | 0.000000E+00 | 0.000000E+00 | 0.000000E+00 | 0.000000E+00 | 0.000000E+00 |
| X8 | 0.000000E+00 | 0.000000E+00 | 0.000000E+00 | 0.000000E+00 | 0.000000E+00 | 0.000000E+00 |
| X6Y2 | 0.000000E+00 | 0.000000E+00 | 0.000000E+00 | 0.000000E+00 | 0.000000E+00 | 0.000000E+00 |
| X4Y4 | 0.000000E+00 | 0.000000E+00 | 0.000000E+00 | 0.000000E+00 | 0.000000E+00 | 0.000000E+00 |
| X2Y6 | 0.000000E+00 | 0.000000E+00 | 0.000000E+00 | 0.000000E+00 | 0.000000E+00 | 0.000000E+00 |
| Y8 | 0.000000E+00 | 0.000000E+00 | 0.000000E+00 | 0.000000E+00 | 0.000000E+00 | 0.000000E+00 |
| X8Y | 0.000000E+00 | 0.000000E+00 | 0.000000E+00 | 0.000000E+00 | 0.000000E+00 | 0.000000E+00 |
| X6Y3 | 0.000000E+00 | 0.000000E+00 | 0.000000E+00 | 0.000000E+00 | 0.000000E+00 | 0.000000E+00 |
| X4Y5 | 0.000000E+00 | 0.000000E+00 | 0.000000E+00 | 0.000000E+00 | 0.000000E+00 | 0.000000E+00 |
| X2Y7 | 0.000000E+00 | 0.000000E+00 | 0.000000E+00 | 0.000000E+00 | 0.000000E+00 | 0.000000E+00 |
| Y9 | 0.000000E+00 | 0.000000E+00 | 0.000000E+00 | 0.000000E+00 | 0.000000E+00 | 0.000000E+00 |
| X10 | 0.000000E+00 | 0.000000E+00 | 0.000000E+00 | 0.000000E+00 | 0.000000E+00 | 0.000000E+00 |
| X8Y2 | 0.000000E+00 | 0.000000E+00 | 0.000000E+00 | 0.000000E+00 | 0.000000E+00 | 0.000000E+00 |
| X6Y4 | 0.000000E+00 | 0.000000E+00 | 0.000000E+00 | 0.000000E+00 | 0.000000E+00 | 0.000000E+00 |
| X4Y6 | 0.000000E+00 | 0.000000E+00 | 0.000000E+00 | 0.000000E+00 | 0.000000E+00 | 0.000000E+00 |
| X2Y8 | 0.000000E+00 | 0.000000E+00 | 0.000000E+00 | 0.000000E+00 | 0.000000E+00 | 0.000000E+00 |
| Y10 | 0.000000E+00 | 0.000000E+00 | 0.000000E+00 | 0.000000E+00 | 0.000000E+00 | 0.000000E+00 |
| Nradius | 1.00E+00 | 1.00E+00 | 1.00E+00 | 1.00E+00 | 1.00E+00 | 1.00E+00 |

| Coefficient | M1 | M2 | M3 | M4 | M5 | M6 |
|---|---|---|---|---|---|---|
| Y-decenter | −242.949 | −116.015 | 15.485 | −94.370 | 162.630 | −15.854 |
| X-rotation | −2.051 | 4.274 | −4.892 | 10.143 | −3.797 | −2.652 |

Figure 11:
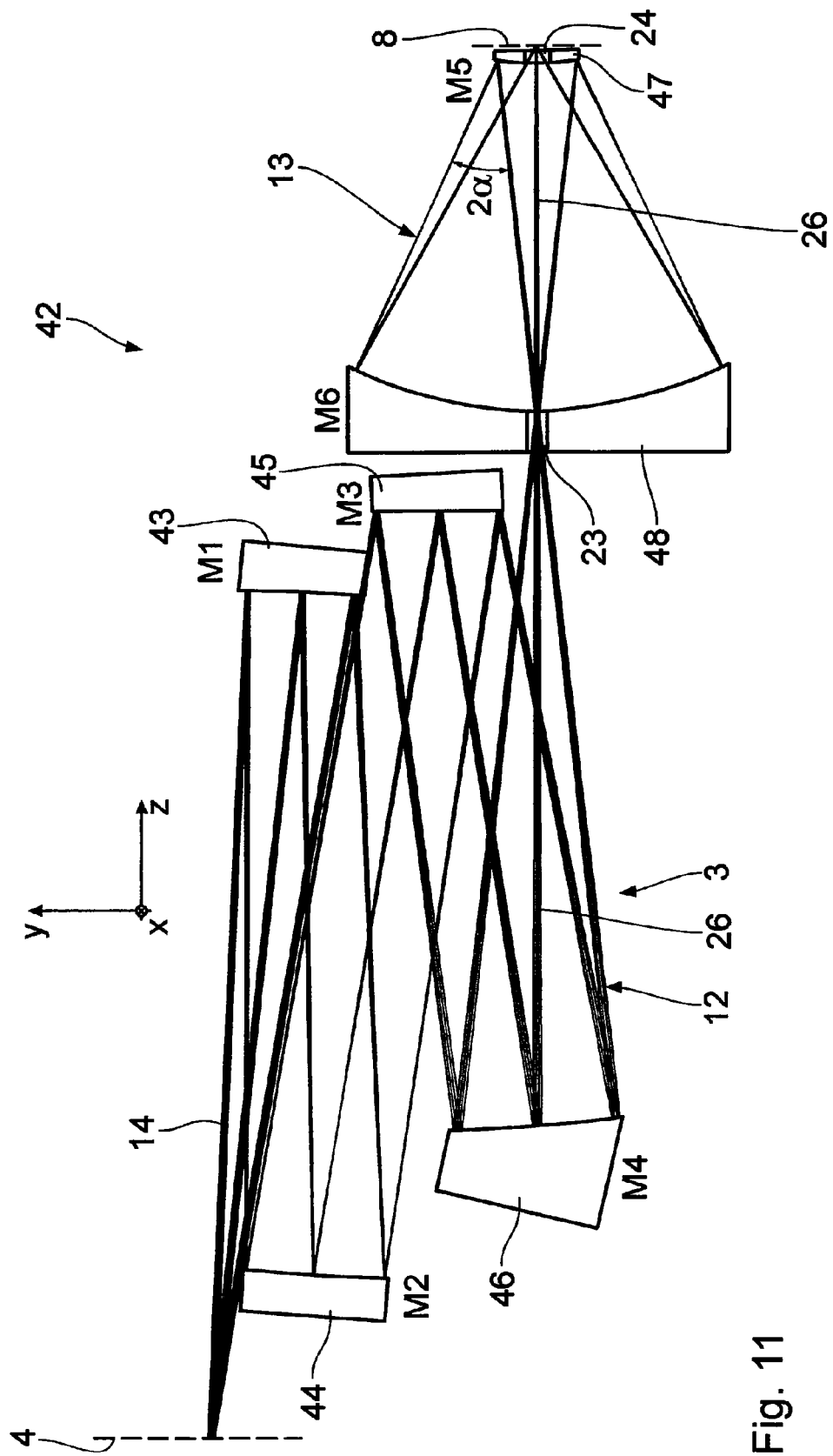
FIG. 11 shows a view similar to that of FIG. 2 of a projection optical system.

FIG. 11 shows a further configuration of a projection optical system 42 which may be used, instead of the projection optical system 6, in the projection exposure installation 1.

Components or reference quantities which correspond to those which have previously been explained with reference to FIGS. 1 to 10 have the same reference numerals and will not again be discussed in detail.

The projection optical system 42 also has six reflection mirrors which are denoted by the reference numerals 43 to 48 in accordance with their sequence in the imaging light path, starting from the object plane 4. The mirrors will also be referred to in the following as M1 to M6. In the projection optical system 42, all of the reflection surfaces are formed as free-form surfaces which cannot be described by a rotationally symmetrical function.

The first mirror 43 is concave, but has only a very slight curve so that it can be simply modified to form a mirror with a zero base curve or to form a convexly curved mirror. The second mirror 44 is concave and the third mirror 45 is convex. The fourth mirror 46 is concave. The fifth mirror 47 is convex. The sixth mirror 48 is concave.

Each of the first three mirrors 43 to 45 has negative angular magnification of the principal ray. The angular magnification of the principal ray of the fourth mirror 46 is infinite since the principal ray 26 extends perpendicular to the image plane 8 after reflection by the fourth mirror 46.

The projection optical system 42 has an image-side numerical aperture of 0.5. The projection optical system 42 has an intermediate image-side numerical aperture of 0.11.

In the projection optical system 42, the free working distance $d_w$ is 20 mm.

The projection optical system 42 has a reduction factor of 8.

The dimensions of the image field in the projection optical system 42 correspond to those of the projection optical systems 6 and 35.

In the projection optical system 42, the maximum angle of reflection also occurs in the outer edge rays reflected on the fifth mirror 47 and is α=16°. The quotient of the maximum angle of reflection of the illumination light 3 within the projection optical system 42 and the image-side numerical aperture is 32.

The optical data of the projection optical system 42 are again summarised in the following:

The image-side numerical aperture NA is 0.5. The dimensions of the image field are 1×13 mm². The reducing imaging magnification level is 8×. The image field 7 is rectangular. The wavelength of the illumination light 3 is 13.5 nm. The sequence of the optical effects of the mirrors M1 to M6 (negative N; positive P) is PPNPNP. Principal rays enter convergently into the projection optical system 42 from the object plane 4. An aperture stop is arranged on the mirror M2 for limiting the illumination light at the edge. The z-distance between the object plane 4 and the image plane 8 is 1,700 mm. The object-image shift is 393 mm. 17.0% of the surfaces illuminated in the pupil planes are obscured. The projection optical system 42 has a wavefront error (rms) of 0.100 in units of the wavelength of the illumination light 3. The distortion is 16 nm. The image field curvature is 35 nm. The angle of the principal ray at the central object field point is 6°. The mirror M1 has dimensions (x/y) of 164×134 mm². The mirror M2 has dimensions of 312×170 mm². The mirror M3 has dimensions of 147×155 mm². The mirror M4 has dimensions of 354×196 mm². The mirror M5 has dimensions of 103×96 mm². The mirror M6 has dimensions of 457×444 mm². The sequence of the principal ray angle of incidence of the principal ray 26 of the central object field point on the mirrors M1 to M6 is 3.54°, 5.15°, 9.11°, 4.45°, 0.01° and 0.01°. The sequence of the maximum angle of incidence on the mirrors M1 to M6 is 6.18°, 5.62°, 9.80°, 6.85°, 15.94°, and 2.36°. The sequence of the bandwidths of the angle of incidence on the mirrors M1 to M6 is 5.16°, 1.08°, 1.52°, 4.63°, less than 15.94° and less than 2.38°. The working distance in the object plane 4 is 200 mm. The working distance in the image plane 8 is 20 mm. The ratio of the distance between the object plane 4 and the mirror M1 and the distance between the object plane 4 and the mirror M2 is 5.07. The mirrors M1 and M2 have a minimum distance between the used reflection surface and the closest imaging light path which does not act upon the mirror (free board) of less than 25 mm. The distance between the object plane 4 and the mirror M1 and the distances between the pairs of mirrors M1-M2, M2-M3, M3-M4 and M4-M5 are greater than 40% of the distance between the object plane and the image plane.

The optical design data for the reflection surfaces of the mirrors M1 to M6 of the projection optical system 42 can be gathered from the following tables, which correspond to the tables previously provided for the projection optical system 6 in accordance with FIG. 2.

| Surface | Radius | Thickness | Mode |
| --- | --- | --- | --- |
| Object | INFINITY | 1014.317 | |
| Mirror 1 | −2704.152 | −814.317 | REFL |
| Mirror 2 | 531.833 | 0.000 | REFL |
| STOP | INFINITY | 935.139 | |
| Mirror 3 | 491.748 | −718.533 | REFL |
| Mirror 4 | 870.221 | 1263.419 | REFL |
| Mirror 5 | 245.485 | −424.886 | REFL |
| Mirror 6 | 495.477 | 444.861 | REFL |
| Image | INFINITY | 0.000 | |

| Coeff. | M1 | M2 | M3 | M4 | M5 | M6 |
| --- | --- | --- | --- | --- | --- | --- |
| K | 1.144605E+01 | −9.050341E−01 | −1.089239E+00 | −6.248739E−01 | 2.948620E+00 | 1.091603E−01 |
| Y | 0.000000E+00 | 0.000000E+00 | 0.000000E+00 | 0.000000E+00 | 0.000000E+00 | 0.000000E+00 |
| X2 | 2.857150E−04 | −5.920234E−04 | −2.610462E−04 | −1.368396E−04 | −4.475618E−04 | 1.730506E−05 |
| Y2 | 9.176083E−05 | −8.321210E−04 | −7.892918E−04 | −2.573840E−04 | −4.405714E−04 | 1.563424E−05 |
| X2Y | 7.455682E−07 | −9.307510E−09 | 4.809832E−08 | 3.116002E−08 | 4.341012E−09 | −3.269435E−09 |
| Y3 | 4.605832E−08 | −1.943924E−07 | −2.212409E−07 | 7.169569E−09 | −4.274845E−07 | −4.266065E−09 |
| X4 | −3.659110E−10 | −1.644174E−11 | 8.510237E−10 | 1.713005E−11 | 2.190981E−09 | 1.081076E−11 |
| X2Y2 | −1.689952E−09 | −3.435735E−10 | 6.957800E−12 | −9.146320E−12 | −5.946668E−09 | 2.690241E−11 |
| Y4 | −2.561746E−10 | −6.556489E−10 | 1.590530E−10 | 3.880664E−13 | −1.024229E−08 | −1.427930E−12 |
| X4Y | −3.302144E−12 | −1.451447E−13 | −3.859663E−12 | 4.923124E−14 | −2.729947E−11 | −2.149830E−14 |
| X2Y3 | −2.296129E−12 | 2.463662E−13 | 4.902075E−12 | 4.230604E−14 | −2.255029E−11 | 5.867643E−15 |
| Y5 | 4.869118E−13 | 2.042378E−12 | −5.901335E−13 | −2.503638E−15 | −1.535539E−11 | 1.362505E−14 |
| X6 | 2.532299E−14 | 3.607331E−16 | −3.635906E−15 | −1.910942E−17 | 5.572070E−14 | 1.020771E−17 |
| X4Y2 | 1.050746E−14 | 3.556935E−15 | 6.819544E−14 | 1.635726E−16 | 4.514505E−13 | 3.413101E−17 |
| X2Y4 | 2.215727E−14 | 8.029448E−15 | −1.161921E−14 | −1.548212E−17 | −4.560072E−13 | −1.111206E−17 |
| Y6 | −9.649794E−16 | 7.587037E−15 | 4.555774E−16 | 1.222675E−17 | −3.875470E−13 | −2.539409E−17 |
| X6Y | −1.936844E−16 | −4.478100E−19 | 9.189317E−17 | 3.837055E−19 | −3.689123E−15 | −6.718113E−20 |
| X4Y3 | 5.354672E−17 | 1.140666E−17 | −4.339139E−16 | 2.254755E−19 | −3.854918E−15 | 7.351666E−20 |
| X2Y5 | −3.646598E−17 | 3.260549E−17 | −2.644153E−17 | −8.425001E−20 | 9.184510E−16 | 1.186287E−19 |
| Y7 | 6.063079E−19 | 9.615056E−17 | 1.324974E−18 | −1.850786E−21 | −2.798829E−15 | 6.587133E−20 |
| X8 | 5.617315E−19 | 1.744698E−21 | 8.327575E−19 | 2.970358E−21 | 4.324289E−18 | 5.187555E−23 |
| X6Y2 | 5.094397E−19 | 3.594344E−20 | −9.344050E−19 | 2.069107E−21 | 4.500525E−17 | 3.412692E−23 |
| X4Y4 | −2.079112E−19 | 1.260510E−19 | 1.229358E−18 | −7.743007E−23 | −2.240628E−17 | 6.720118E−23 |

-continued

| | | | | | |
|---|---|---|---|---|---|
| X2Y6 | −1.595633E−20 | 1.627768E−19 | −2.763971E−20 | 1.708991E−22 | −4.013864E−17 | 2.519384E−23 |
| Y8 | 1.940634E−21 | 4.827783E−19 | 5.031625E−21 | −1.299209E−23 | −6.317984E−18 | −9.073694E−23 |
| X8Y | −3.793003E−21 | 2.116730E−23 | −7.801057E−21 | 1.432927E−23 | −4.043104E−19 | −8.431854E−26 |
| X6Y3 | −6.345560E−22 | 2.804678E−22 | 4.289367E−21 | 2.349972E−24 | −4.743148E−19 | 5.385876E−25 |
| X4Y5 | −1.925796E−22 | 9.316727E−22 | −1.053643E−21 | −3.225767E−23 | 1.860041E−19 | 1.381096E−24 |
| X2Y7 | 8.214685E−23 | 2.388724E−21 | 8.375537E−22 | 2.766796E−25 | 1.013965E−19 | 1.617787E−24 |
| Y9 | 1.703546E−24 | 4.526481E−21 | −2.966098E−23 | 1.800745E−26 | 3.422243E−22 | 6.810995E−25 |
| X10 | 1.991274E−24 | 5.335545E−26 | 1.741970E−24 | 7.205669E−28 | 0.000000E+00 | −5.791957E−28 |
| X8Y2 | 6.491228E−24 | 1.977752E−24 | 1.571441E−23 | 1.716622E−26 | 0.000000E+00 | −1.179271E−26 |
| X6Y4 | 4.259954E−25 | 7.623140E−24 | −1.086567E−23 | 0.000000E+00 | 0.000000E+00 | −1.124411E−26 |
| X4Y6 | 8.190088E−25 | 1.642262E−23 | −1.531617E−24 | 0.000000E+00 | 0.000000E+00 | −6.908146E−27 |
| X2Y8 | −3.305040E−26 | 2.718356E−23 | −1.734683E−24 | 4.000570E−29 | 0.000000E+00 | −4.575592E−27 |
| Y10 | −5.699224E−27 | 2.657964E−23 | 5.982496E−26 | 4.841412E−30 | 0.000000E+00 | −1.211899E−27 |
| Nradius | 1.00E+00 | 1.00E+00 | 1.00E+00 | 1.00E+00 | 1.00E+00 | 1.00E+00 |

| Coefficient | M1 | M2 | M3 | M4 | M5 | M6 |
|---|---|---|---|---|---|---|
| Y-decenter | −262.562 | −14.529 | −294.373 | 184.266 | −286.525 | −283.609 |
| X-rotation | −5.767 | −4.073 | 2.602 | −13.391 | 0.685 | 0.041 |

Figure 12:
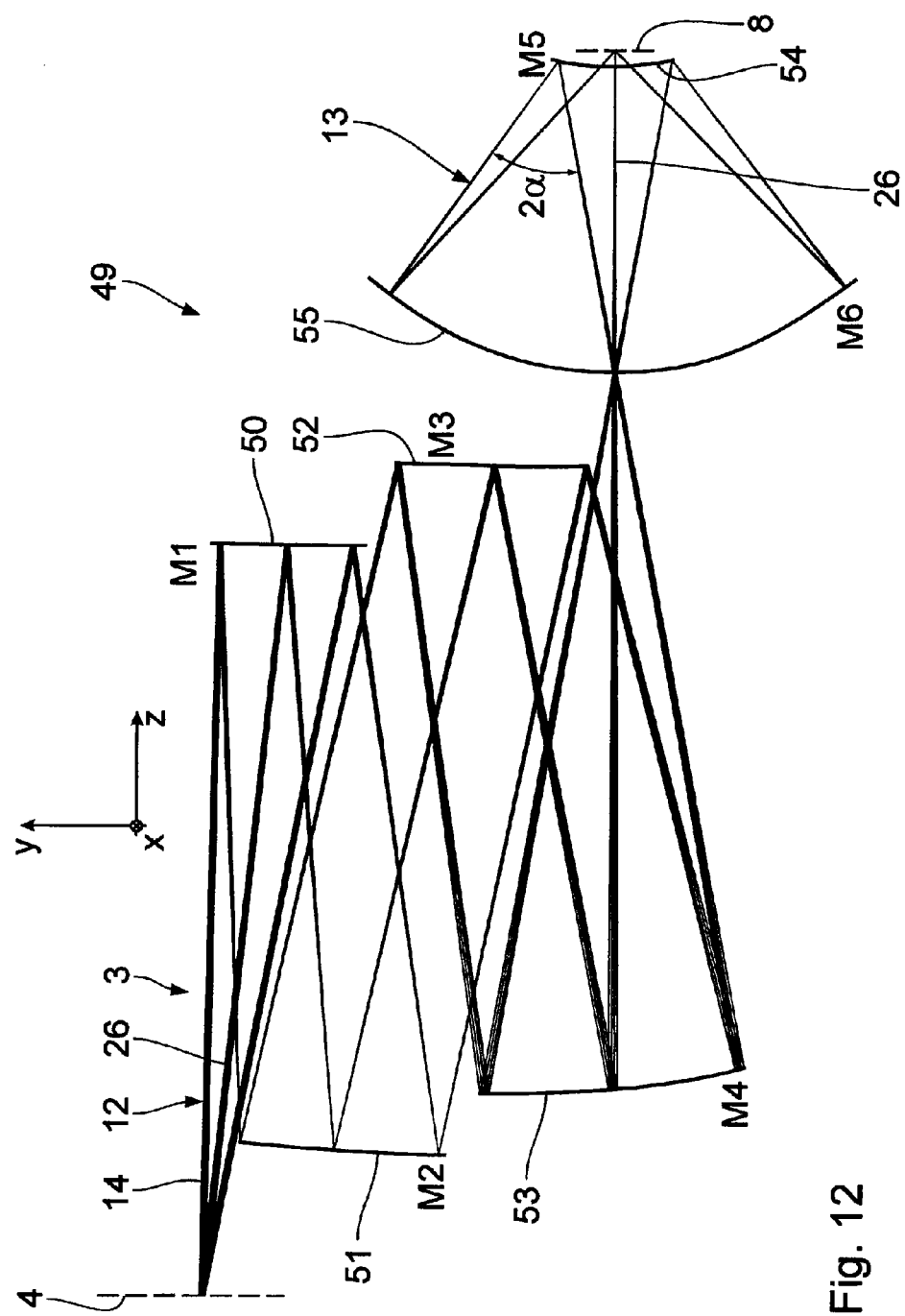
FIG. 12 shows a view similar to that of FIG. 2 of a projection optical system.

FIG. 12 shows a projection optical system 49 which can be used in the projection exposure installation 1 in the case of UV illumination instead of the projection optical system 6. Components or reference quantities which correspond to those which have been previously explained with reference to FIGS. 1 to 11 have the same reference numerals and will not be discussed in detail again.

The projection optical system 49 also has six reflection mirrors which are denoted with the reference numerals 50 to 55 in accordance with their sequence in the imaging light path, from the object plane 4. The mirrors will also be referred to in the following as M1 to M6. In the projection optical system 49, all of the reflection surfaces are formed as free-form surfaces which cannot be described by a rotationally symmetrical function.

In the configuration shown in FIG. 12, the sequence of the base curves of the mirror is the same as in the configuration of FIG. 11. Again, the first mirror is only very slightly curved and can thus be simply converted into a mirror with a zero base curve (planar base curve) or to a mirror with a convex base curve.

Each of the first three mirrors 50 to 52 has negative angular magnification of the principal ray. The angular magnification of the principal ray of the fourth mirror 53 is infinite since the principal ray 26 extends perpendicular to the image plane 8 after reflection on the fourth mirror 53.

The projection optical system 49 has an image-side numerical aperture of 0.7. The projection optical system 49 has an intermediate image numerical aperture of 0.14.

In the projection optical system 49, the free working distance $d_w$ is 20 mm.

The projection optical system 49 has a reduction factor of 8.

In the projection optical system 49, the image field dimensions correspond to those of the projection optical systems 6, 35 and 42. The image field dimensions are 13×1 mm².

In the projection optical system 49, the maximum angle of reflection also occurs in the outer edge rays reflected on the fifth mirror 54 and is α=23.8°. The quotient of the maximum angle of reflection of the imaging light 3 within the projection optical system and the image-side numerical aperture is 34°.

The optical data for the projection optical system 49 are again summarised in the following:

The image-side numerical aperture NA is 0.7. The dimensions of the image field 7 are 1×13 mm². The reducing magnification level is 8×. The image field 7 is rectangular. The wavelength of the illumination light 3 is 193.0 nm. The sequence of the optical effects of the mirrors M1 to M6 (negative N; positive P) is PPNPNP. Principal rays enter the projection optical system 49 in a convergent manner from the object plane 4. An aperture stop is arranged on the mirror M2 for limiting the illumination light at the edge. The z-distance between the object plane 4 and the image plane 8 is 1,700 mm. The object-image shift is 549 mm. 11.6% of the surfaces illuminated in the pupil planes are obscured. The projection optical system 49 has wavefront error (rms) of 0.053 in units of the wavelength of the illumination light. The distortion is 400 nm. The image field curvature is 130 nm. The angle of the principal ray on the central object field point is 6°. The mirror M1 has dimensions (x/y) of 204×184 mm². The mirror M2 has dimensions of 652×271 mm². The mirror M3 has dimensions of 192×260 mm². The mirror M4 has dimensions of 515×347 mm². The mirror M5 has dimensions of 162×153 mm². The mirror M6 has dimensions of 643×619 mm². The sequence of the principal ray angle of incidence of the principal ray 26 of the central object field point on the mirrors M1 to M6 is 5.40°, 8.76°, 11.83°, 5.37°, 0.01° and 0.02°. The sequence of the maximum angle of incidence on the mirrors M1 to M6 is 9.70°, 10.06°, 13.22°, 8.94°, 24.01° and 3.62°. The sequence of the bandwidths of the angle of incidence on the mirrors M1 to M6 is 8.23°, 2.81°, 3.10°, 6.95°, less than 24.01° and less than 3.62°.

The working distance in the object plane 4 is 200 mm. The working distance in the image plane 8 is 20 mm. The ratio of the distance between the object plane 4 and the mirror M1 and the distance between the object plane 4 and the mirror M2 is 5.11. The mirrors M1 to M3 have a minimum distance between the used reflection surface and the closest imaging light path which does not act upon the mirrors (free board) of less than 25 mm. The distance between the object plane 4 and the mirror M1 and the distances between the pairs of mirrors M1-M2, M2-M3, M3-M4, M4-M5 are greater than 40% of the distance between the object and the image plane.

The optical design data for the reflection surfaces of the mirrors M1 to M6 can be gathered from the following tables which correspond to those of the projection optical system 6 of FIG. 2 described above.

| Surface | Radius | Thickness | Mode |
|---|---|---|---|
| Object | INFINITY | 1022.710 | |
| Mirror 1 | −7390.359 | −822.710 | REFL |
| Mirror 2 | 513.847 | 0.000 | REFL |

-continued

| Surface | Radius | Thickness | Mode |
|---|---|---|---|
| STOP | INFINITY | 942.710 | |
| Mirror 3 | 501.145 | −842.710 | REFL |
| Mirror 4 | 843.206 | 1380.024 | REFL |
| Mirror 5 | 578.181 | −417.314 | REFL |
| Mirror 6 | 496.039 | 437.290 | REFL |
| Image | INFINITY | 0.000 | |

| Coeff. | M1 | M2 | M3 | M4 | M5 | M6 |
|---|---|---|---|---|---|---|
| K | 3.481687E+02 | −9.241869E−01 | −7.566344E−01 | −5.019615E−01 | 1.965937E+01 | 1.267270E−01 |
| Y | 0.000000E+00 | 0.000000E+00 | 0.000000E+00 | 0.000000E+00 | 0.000000E+00 | 0.000000E+00 |
| X2 | 6.555377E−04 | −5.511453E−04 | 2.158158E−04 | −1.699472E−04 | 2.894217E−04 | 5.126962E−06 |
| Y2 | 3.295088E−05 | −8.776483E−04 | −9.084036E−04 | −2.883162E−04 | 3.472889E−04 | 1.671956E−05 |
| X2Y | −4.245568E−07 | 3.113324E−08 | 7.395458E−07 | 7.821775E−08 | −4.476295E−07 | −6.764774E−09 |
| Y3 | 1.390824E−08 | −1.918862E−07 | 8.435308E−08 | −2.628080E−08 | 5.451515E−08 | −2.659596E−09 |
| X4 | −3.307013E−10 | −1.191040E−11 | 3.063977E−09 | −3.668514E−11 | 5.377968E−09 | 8.032524E−12 |
| X2Y2 | 3.290269E−09 | −6.921528E−11 | 1.233667E−11 | 1.187534E−10 | 2.249411E−08 | 2.023497E−11 |
| Y4 | −1.463471E−10 | 5.786874E−11 | −6.021292E−12 | −1.106757E−10 | 7.037151E−09 | −5.631157E−12 |
| X4Y | 2.736617E−12 | 4.032934E−15 | −6.984058E−13 | −8.039415E−14 | −1.260298E−12 | −5.006977E−15 |
| X2Y3 | 3.522297E−13 | −1.166725E−13 | −2.454747E−12 | 5.957814E−13 | −1.250078E−11 | −5.698119E−15 |
| Y5 | −2.490692E−13 | 2.590308E−12 | −3.745572E−13 | −1.408338E−14 | −2.442407E−11 | −7.179108E−15 |
| X6 | −1.862455E−14 | 6.281324E−18 | −2.148629E−14 | −4.004672E−17 | 1.997946E−13 | −1.011352E−17 |
| X4Y2 | −7.981936E−14 | 4.496399E−17 | −1.242837E−14 | −6.611499E−16 | 2.590470E−13 | −6.909855E−17 |
| X2Y4 | −4.901925E−14 | −3.029567E−16 | −3.758114E−15 | 9.515240E−16 | −2.673556E−13 | −1.224111E−16 |
| Y6 | 2.434885E−16 | 1.266995E−14 | 1.367511E−16 | 6.466128E−17 | 2.511816E−13 | −4.838450E−17 |
| X6Y | 2.013761E−16 | 1.162633E−19 | 1.149857E−17 | −3.125791E−19 | −1.332065E−15 | −1.469592E−20 |
| X4Y3 | 3.552832E−16 | 1.010087E−18 | −1.441396E−16 | −1.842092E−18 | −2.995433E−15 | −1.117419E−19 |
| X2Y5 | −9.924040E−19 | −2.022287E−19 | −1.400280E−17 | 1.100935E−18 | −2.362122E−15 | −1.093754E−19 |
| Y7 | 1.950700E−18 | −1.249257E−17 | 6.126115E−19 | 3.018212E−20 | 2.029387E−15 | −2.279935E−20 |
| X8 | −1.816371E−19 | 8.241847E−23 | 1.607901E−19 | −2.596493E−23 | 6.322415E−18 | −1.205865E−22 |
| X6Y2 | −1.231881E−18 | 1.602604E−21 | 2.552251E−19 | −7.939427E−22 | 1.136621E−17 | −2.391492E−22 |
| X4Y4 | −1.457234E−19 | 1.343999E−20 | −6.277420E−19 | −2.461049E−21 | −7.995361E−19 | −1.719723E−22 |
| X2Y6 | 5.627869E−19 | 1.086725E−20 | 2.371593E−20 | 9.514060E−22 | −3.361939E−17 | −2.245468E−22 |
| Y8 | 3.626451E−21 | −2.072810E−20 | −3.369745E−21 | −6.523915E−23 | −4.042492E−18 | −1.070962E−22 |
| X8Y | 1.644403E−21 | 5.521298E−25 | 7.387878E−22 | −4.934005E−26 | −4.739358E−20 | 1.327526E−25 |
| X6Y3 | 2.012939E−21 | 1.839641E−23 | 6.948031E−22 | −5.010250E−25 | −3.213699E−19 | 8.788103E−25 |
| X4Y5 | −9.196304E−22 | 1.613032E−22 | −7.384331E−22 | −1.017620E−24 | −4.869993E−19 | 1.435145E−24 |
| X2Y7 | −8.444082E−22 | 4.724429E−22 | 1.160142E−22 | 5.807469E−25 | −3.565433E−19 | 5.071171E−25 |
| Y9 | −1.391751E−24 | −1.535204E−22 | −1.540508E−24 | 3.217510E−27 | −5.879640E−20 | −1.515906E−26 |
| X10 | 0.000000E+00 | 0.000000E+00 | 0.000000E+00 | 0.000000E+00 | 0.000000E+00 | 0.000000E+00 |
| X8Y2 | 0.000000E+00 | 0.000000E+00 | 0.000000E+00 | 0.000000E+00 | 0.000000E+00 | 0.000000E+00 |
| X6Y4 | 0.000000E+00 | 0.000000E+00 | 0.000000E+00 | 0.000000E+00 | 0.000000E+00 | 0.000000E+00 |
| X4Y6 | 0.000000E+00 | 0.000000E+00 | 0.000000E+00 | 0.000000E+00 | 0.000000E+00 | 0.000000E+00 |
| X2Y8 | 0.000000E+00 | 0.000000E+00 | 0.000000E+00 | 0.000000E+00 | 0.000000E+00 | 0.000000E+00 |
| Y10 | 0.000000E+00 | 0.000000E+00 | 0.000000E+00 | 0.000000E+00 | 0.000000E+00 | 0.000000E+00 |
| Nradius | 1.00E+00 | 1.00E+00 | 1.00E+00 | 1.00E+00 | 1.00E+00 | 1.00E+00 |

| Coefficient | M1 | M2 | M3 | M4 | M5 | M6 |
|---|---|---|---|---|---|---|
| Y-decenter | −197.752 | −67.646 | −76.378 | −20.289 | −432.652 | −422.877 |
| X-rotation | −1.837 | −3.960 | −2.990 | −9.847 | −0.659 | −1.856 |

Figure 13:
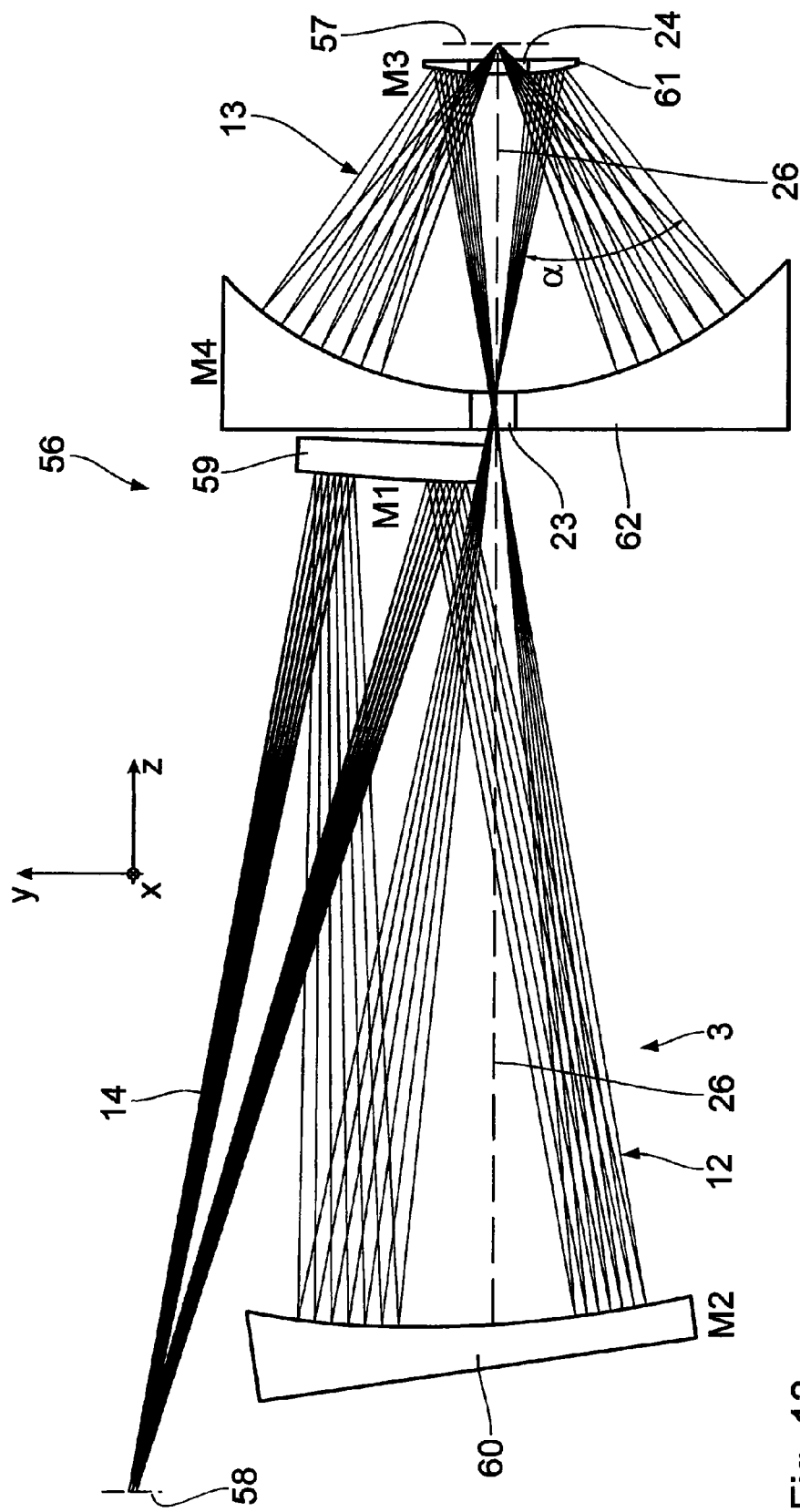
FIG. 13 shows a view similar to that of FIG. 11 of a microscope lens for inspecting wafers.

FIG. 13 shows a microscope lens 56 which can be used for inspecting projection masks required for projection exposure or lithography or for inspecting of exposed wafers 10. The microscope lens images a microscope object plane or substrate plane 57, which coincides with the image plane 8 during projection of the projection exposure installation 1, on a microscope image plane 58. The construction of the microscope lens 56 is similar, for example, to that of the projection object 6 in FIG. 2, with the difference that, in the microscope lens 56, the object and image planes are exchanged in comparison to the projection optical system 6. The object to be analysed is therefore located at the high aperture portion of the microscope lens 56 and an image-recording device, for example a CCD camera is located at the low aperture portion of the microscope lens 56. In the light path between the microscope image plane 58 and the substrate plane 57, the microscope lens 56 has a total of four mirrors 59 to 62 which are numbered in this order and are also referred to as M1 to M4. The third mirror 61 and the fourth mirror 62 of the microscope lens 56 correspond to the mirrors M5, M6 of the previously discussed projection optical systems in terms of their design positions and the through-holes 23, 24. The four mirrors 59 to 62 are configured as free-form surfaces which cannot be described by a rotationally symmetrical function. Alternatively, it is also possible for at least one of the mirrors 59 to 62 to have a free-form reflection surface of this type.

The first mirror 59 has negative angular magnification of the principal ray. The second mirror 60 has infinite angular magnification of the principal ray, since the principal ray 26 extends perpendicularly to the substrate plane 57 from the second mirror 60. The angular magnifications of the principal ray of the third mirror 61 and the fourth mirror 62 are correspondingly undefined.

The microscope lens 56 has a numerical aperture of 0.7. The microscope lens 56 has an intermediate image-side numerical aperture of 0.17.

In the microscope lens 56, the maximum angle of reflection α is again achieved by the outer edge rays of the mirror 57 including the through-hole 24 and is 24°. Correspondingly, the quotient of this angle of reflection and the numerical aperture is 34°.

The projection optical systems 6, 35, 42, 49 and the microscope lens 56 may be operated using wavelengths of the illumination or imaging light 3 other than EUV wavelengths. For example, it is also possible to use the free-form constructions for visible wavelengths.

The projection optical systems 6, 35, 42, 49, the microscope lens 56 and the optical systems described in the following in relation to FIGS. 14 to 17 can be constructed in such a way that, with the exception of the light path in the region of the through-holes 23, 24, there is always a distance of less than 25 mm, but greater than 1 mm (e.g., greater than 5 mm) maintained between the individual rays 14 and the respective mirror M1 to M6 not acted upon, or 59 to 62 when acted upon by reflection of the illumination light 3 in the desired manner. This simplifies the constructional requirements of the respective optical system.

Figure 14:
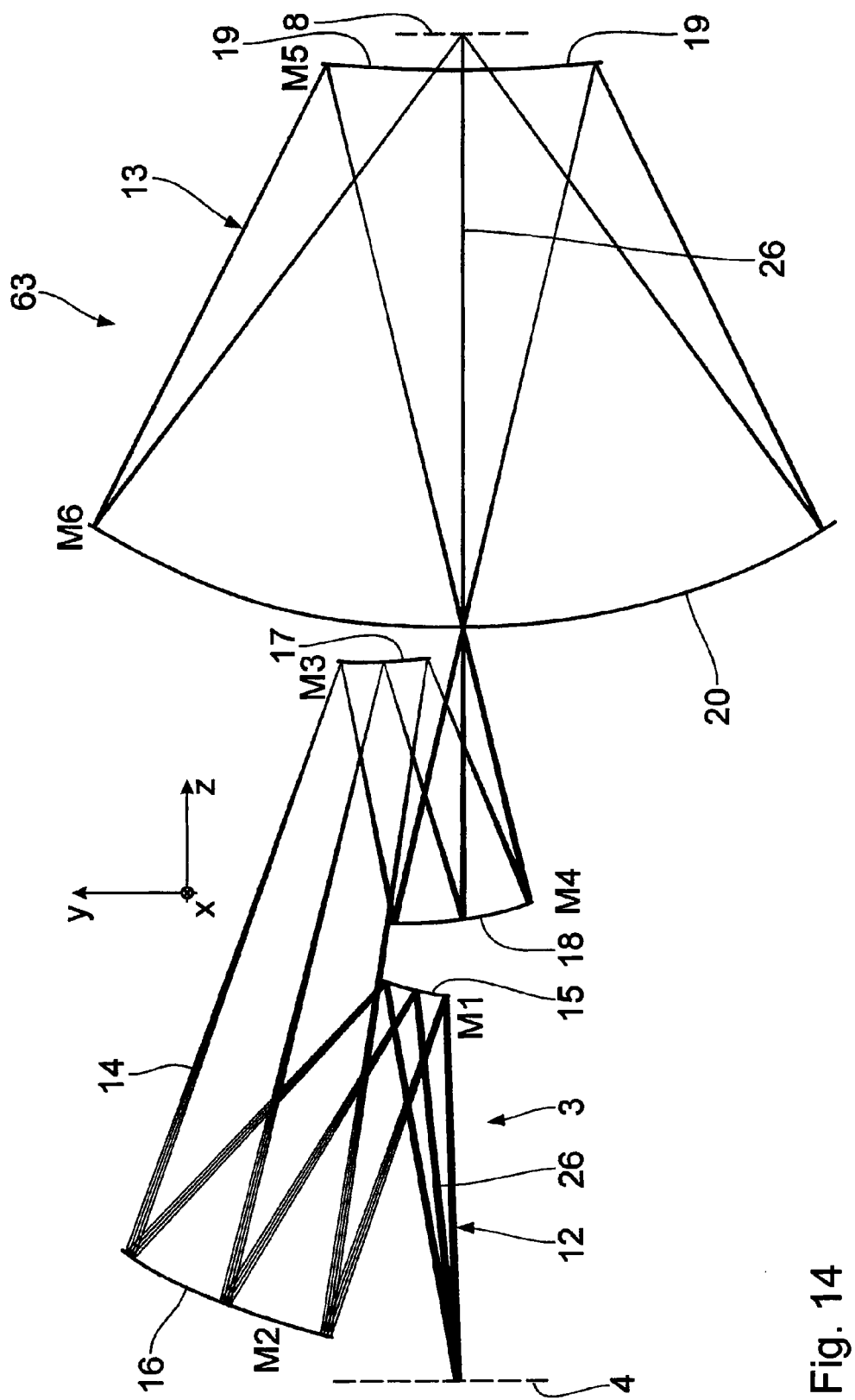
FIGS. 14 and 15 show two further views similar to that of FIG. 2 of a projection optical system.

FIG. 14 shows a further configuration of a projection optical system 63 which can be used in the projection exposure installation 1, again with EUV illumination, instead of the projection optical system 6. Components or reference quantities which correspond to those previously discussed in relation to the projection optical systems 6, 35, 42, 49 of FIGS. 1 to 12 have the same reference numerals and will not be discussed in detail again. In the following only the substantial differences between the projection optical system 63 and the previously explained projection optical systems 6, 35, 42, 49 will be discussed.

The optical data for the projection optical system 63 are as follows:

The image-side numerical aperture NA is 0.6. The dimensions of the image field 7 are 1×13 mm². The reducing magnification level is 8×. The image field 7 is rectangular. The wavelength of the illumination light 3 is 13.5 nm. The projection optical system 63 has six mirrors M1 to M6. The sequence of the optical effects of the mirrors M1 to M6 (negative N; positive P) is NPNPNP. The single intermediate image of the projection optical system 63 is present between the mirrors M4 and M5. Principal rays enter the projection optical system 63 in a convergent manner from the object plane 4. An aperture stop for limiting the illumination light at the edge is arranged on mirror M3. The z-distance between the object plane 4 and the image plane is 1,500 mm. The object-image shift is 7.07 mm. 5.7% of the surfaces illuminated in the pupil planes are obscured. The projection optical system 63 has a wavefront error (rms) of 0.034 in units of the wavelength of the illumination light 3. The distortion is 15 nm. The image field curvature is 10 nm. The angle of the principal ray at the central object field point is 5.9°. The mirror M1 has dimensions (x/y) of 126×73 mm². The mirror M2 has dimensions of 339×164 mm². The mirror M3 has dimensions of 100×96 mm². The mirror M4 has dimensions of 196×150 mm². The mirror M5 has dimensions of 307×298 mm². The mirror M6 has dimensions of 814×806 mm². The sequence of the principal ray angle of incidence of the principal ray 26 of the central object field point on the mirrors M1 to M6 is 18.61°, 8.76°, 15.44°, 8.53°, 0.00° and 0.00°. The sequence of the maximum angle of incidence on the mirrors M1 to M6 is 26.60°, 11.80°, 15.98°, 12.32°, 20.14° and 5.11°. The sequence of the bandwidths of the angle of incidence on the mirrors M1 to M6 is 16.06°, 6.30°, 1.03°, 7.87°, less than 20.14° and less than 5.11°. The sequence of the angular magnification of the principal ray of the mirrors M1 to M3 (negative N; positive P) is NPN. The working distance in the object plane 4 is 102 mm. The working distance in the image plane is 40 mm. The ratio of the distance between the object plane 4 and the mirror M1 and the distance between the object plane 4 and the mirror M2 is 4.13. The mirrors M1 and M4 have a minimum distance between the used reflection surfaces and the closest imaging light path which does not act on the mirror (free board) of less than 25 mm. The distances between the pairs of mirrors M2-M3, M4-M5, M5-M6 and the distance between the mirror M6 and the image plane 8 are less than 40% of the distance between the object plane 4 and the image plane 8.

The optical design data for the reflection surfaces of the mirrors M1 to M6 of the projection optical system 63 can be gathered from the following tables, which correspond to the tables provided for the projection optical system 6 in accordance with FIG. 2.

| Surface | Radius | Thickness | Mode |
|---|---|---|---|
| Object | INFINITY | 423.049 | |
| Mirror 1 | 291.429 | −320.693 | REFL |
| Mirror 2 | 682.291 | 698.472 | REFL |
| Mirror 3 | 327.553 | 0.000 | REFL |
| STOP | INFINITY | −250.085 | |
| Mirror 4 | 398.721 | 909.257 | REFL |
| Mirror 5 | 1753.638 | −620.641 | REFL |
| Mirror 6 | 834.258 | 660.641 | REFL |
| Image | INFINITY | 0.000 | |

| Coeff. | M1 | M2 | M3 | M4 | M5 | M6 |
|---|---|---|---|---|---|---|
| K | −9.797768E−01 | −2.654407E−01 | 3.633187E+00 | −2.607926E−01 | 3.367484E+01 | 3.003345E−01 |
| Y | 0.000000E+00 | 0.000000E+00 | 0.000000E+00 | 0.000000E+00 | 0.000000E+00 | 0.000000E+00 |
| X2 | −6.757907E−04 | −9.897313E−05 | −6.055737E−04 | −1.712326E−04 | 8.316524E−06 | 3.449849E−05 |
| Y2 | −6.711750E−04 | −1.286106E−04 | −5.464279E−04 | −1.127817E−04 | 1.666997E−06 | 3.303139E−05 |
| X2Y | −1.718471E−07 | 8.106102E−09 | 3.559721E−08 | −1.625547E−07 | −3.433987E−08 | −5.594447E−10 |
| Y3 | 8.441316E−08 | 2.066449E−08 | 2.993241E−07 | −2.438542E−07 | −5.340235E−09 | 2.648587E−10 |
| X4 | −4.235340E−10 | −6.184068E−11 | −1.590557E−08 | −5.148175E−11 | 9.293663E−10 | 1.431375E−12 |
| X2Y2 | −2.833593E−10 | −1.232739E−10 | −2.294580E−08 | 6.076202E−11 | 1.884838E−09 | 4.501941E−12 |
| Y4 | −6.283000E−09 | −1.538541E−11 | −7.807703E−09 | 4.592939E−10 | 9.735975E−10 | 3.169895E−12 |
| X4Y | 5.216941E−13 | 1.355055E−14 | −4.125213E−11 | −5.236068E−13 | −6.108177E−14 | 4.760532E−16 |
| X2Y3 | −5.462082E−12 | 1.539145E−13 | 5.882108E−11 | −7.857103E−13 | 5.606699E−14 | −1.383433E−15 |
| Y5 | 3.841515E−11 | −4.826907E−15 | 6.536341E−11 | −1.173929E−12 | 6.122980E−14 | −1.198686E−15 |
| X6 | −2.961655E−14 | −5.649609E−16 | −5.319482E−13 | 1.037860E−15 | 1.575126E−15 | 5.280799E−19 |
| X4Y2 | −6.986732E−15 | 1.523728E−17 | −1.125923E−12 | 4.138161E−15 | 5.066143E−15 | 3.110524E−18 |
| X2Y4 | 5.755669E−14 | −1.992110E−16 | −9.962349E−13 | −5.642387E−15 | 5.364157E−15 | 3.810873E−18 |
| Y6 | −7.476803E−14 | −3.652597E−17 | −1.721064E−13 | −2.311791E−16 | 1.498586E−15 | 9.716738E−19 |
| X6Y | 8.136042E−16 | 1.347989E−18 | 1.560712E−15 | −3.431381E−17 | 1.006276E−18 | −1.255738E−22 |
| X4Y3 | 1.102636E−17 | 9.697709E−22 | 2.841374E−15 | −6.361244E−17 | −5.733345E−19 | −1.261922E−21 |
| X2Y5 | 1.331907E−16 | −1.331590E−20 | 2.163234E−15 | 2.657780E−17 | −1.545019E−18 | −3.386914E−22 |
| Y7 | 3.093492E−17 | 0.000000E+00 | 2.304330E−15 | 1.049058E−19 | 3.738255E−20 | 1.710371E−22 |
| X8 | 1.506508E−18 | 5.810497E−21 | 1.133674E−17 | 6.127110E−21 | 3.186325E−21 | 1.107455E−24 |

-continued

| | | | | | | |
|---|---|---|---|---|---|---|
| X6Y2 | −1.013674E−17 | 6.179938E−22 | −5.629342E−17 | 3.657501E−19 | 2.411205E−20 | 2.133982E−24 |
| X4Y4 | −1.366007E−18 | −3.261229E−22 | −8.750490E−17 | 4.374764E−19 | 3.931624E−20 | 4.739463E−24 |
| X2Y6 | −1.047171E−18 | −1.345299E−22 | −1.260161E−17 | −6.674633E−20 | 2.052091E−20 | 3.396921E−24 |
| Y8 | −9.482484E−19 | −7.567828E−23 | −3.447928E−18 | −3.054349E−21 | 6.173346E−21 | 9.678311E−25 |
| X8Y | −5.877725E−20 | −1.822355E−23 | −4.253705E−19 | −1.365311E−22 | −1.472429E−23 | 2.361551E−27 |
| X6Y3 | 4.790823E−20 | −3.116535E−24 | −6.154610E−19 | −1.894833E−21 | −3.675978E−23 | 1.990878E−27 |
| X4Y5 | 8.584886E−21 | −9.980946E−26 | 2.375768E−19 | −1.854722E−21 | −2.816555E−23 | −4.075851E−27 |
| X2Y7 | −1.694967E−20 | −4.093120E−26 | 7.589434E−19 | −4.379199E−23 | −6.563563E−24 | −5.800819E−27 |
| Y9 | 2.326792E−21 | 0.000000E+00 | 1.307119E−19 | −2.515286E−23 | 2.606727E−24 | −1.858737E−28 |
| X10 | 1.401272E−22 | 6.373969E−27 | 2.615474E−22 | 2.577682E−25 | 4.145747E−26 | −1.274796E−31 |
| X8Y2 | 3.458862E−22 | 1.154175E−26 | −7.752079E−21 | 5.165996E−25 | 1.524801E−25 | −2.154682E−30 |
| X6Y4 | −6.486950E−23 | −8.465791E−29 | −1.437881E−20 | 3.499212E−24 | 2.916563E−25 | 4.867171E−30 |
| X4Y6 | −2.005656E−23 | −2.584491E−28 | −1.352099E−21 | 3.142335E−24 | 3.587746E−25 | 1.828109E−29 |
| X2Y8 | 6.434247E−23 | −5.536465E−29 | 7.452494E−21 | 3.871445E−25 | 2.307038E−25 | 1.576792E−29 |
| Y10 | 1.692634E−24 | 0.000000E+00 | 1.578385E−21 | 1.350146E−25 | 2.372597E−26 | 1.664967E−30 |
| Nradius | 1.00E+00 | 1.00E+00 | 1.00E+00 | 1.00E+00 | 1.00E+00 | 1.00E+00 |

| Coefficient | M1 | M2 | M3 | M4 | M5 | M6 |
|---|---|---|---|---|---|---|
| Y-decenter | 72.424 | −276.725 | 184.767 | −26.657 | 97.145 | 97.828 |
| X-rotation | −3.803 | 24.855 | 1.633 | 24.917 | 0.012 | −0.062 |

Figure 15:
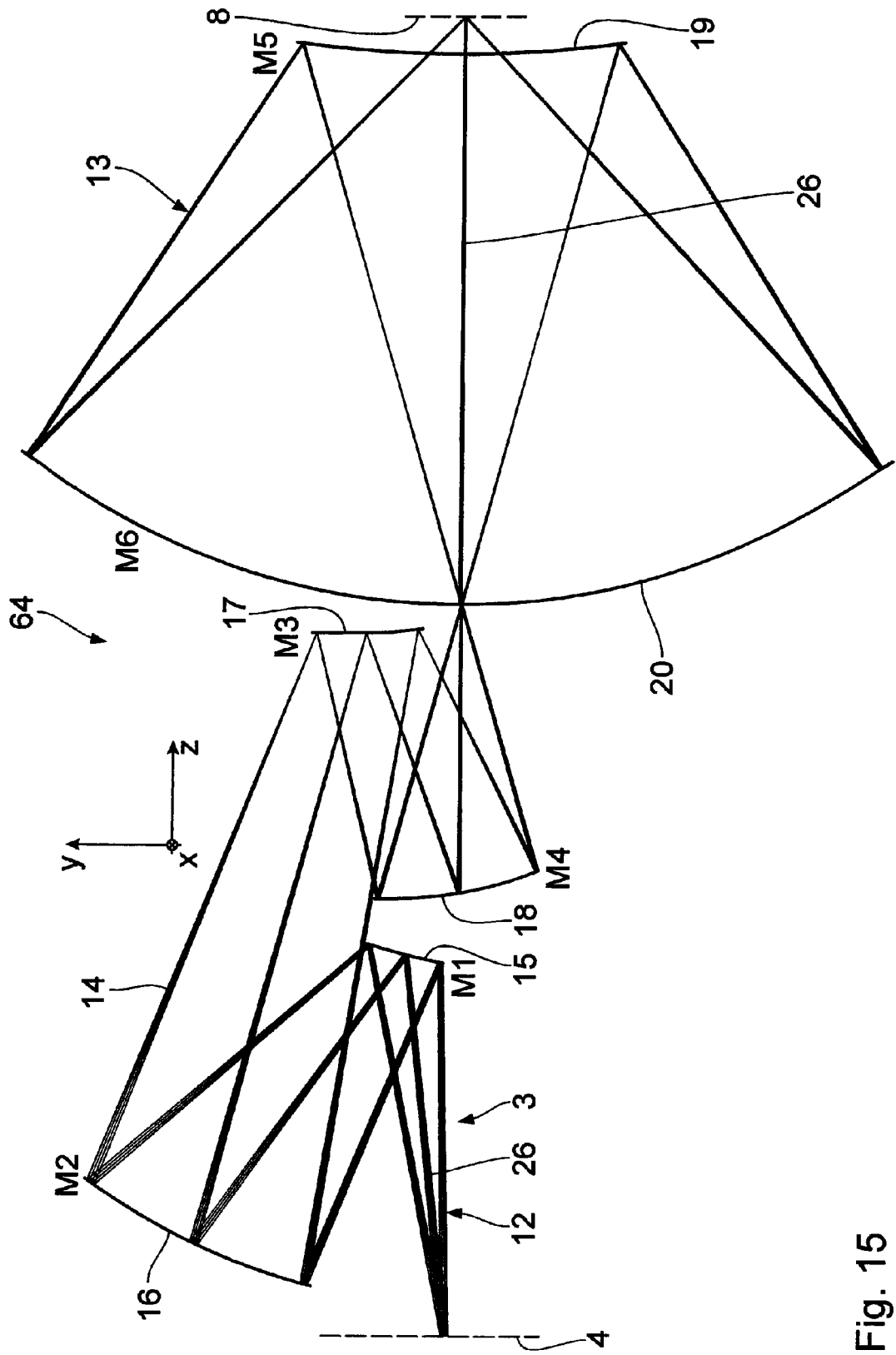

FIG. 15 shows a further configuration of a projection optical system 64 which can be used in the projection exposure installation 1, again with EUV illumination, instead of the projection optical system 6. Components or reference quantities corresponding to those which have previously been explained with reference to FIG. 1 to 12 or 14 have the same reference numerals and will not be discussed in detail again.

The optical data of the projection optical system 64 are summarised in the following:

The image-side numerical aperture NA is 0.7. The dimensions of the image field 7 are 1×13 mm². The reducing magnification level is 8×. The image field 7 is rectangular. The wavelength of the illumination light 7 is 13.5 nm. The projection optical system 64 has six mirrors M1 to M6. The sequence of the optical effects of the mirrors M1 to M6 (negative N; positive P) is NPNPNP. The single intermediate image plane of the projection optical system 64 is present between the mirrors M4 and M5. Principal rays enter the projection optical system 64 in a convergent manner from the object plane 4. An aperture stop for limiting the illumination light at the edge is arranged on mirror M3. The z-distance between the object plane 4 and the image plane 8 is 1,483 mm. The object-image shift is 13.86 mm. 6.4% of the surfaces illuminated in the pupil planes are obscured. The projection optical system 64 has a wavefront error (rms) of 0.062 in units of the wavelength of the illumination light 3. The distortion is 18 nm. The image field curvature is 10 nm. The angle of the principal ray at the central object field point is 5.9°. The mirror M1 has dimensions (x/y) of 134×84 mm². The mirror M2 has dimensions of 365×174 mm². The mirror M3 has dimensions of 121×114 mm². The mirror M4 has dimensions of 220×176 mm². The mirror M5 has dimensions of 363×354 mm². The mirror M6 has dimensions of 956×952 mm². The sequence of the principal ray angle of incidence of the principal ray 26 of the central object field point on the mirrors M1 to M6 is 20.86°, 10.26°, 17.50°, 9.84°, 0.00° and 0.00°. The sequence of the maximum angle of incidence on the mirrors M1 to M6 is 29.83°, 13.67°, 18.09°, 14.40°, 24.60° and 5.70°. The sequence of the bandwidths of the angle of incidence on the mirrors M1 to M6 is 18.23°, 7.18°, 1.06°, 9.50°, less than 16.98° and less than 5.51°. The sequence of the angular magnification of the principal ray of the mirrors M1 to M3 (negative N; positive P) is NPN. The working distance in the object plane 4 is 100 mm. The working distance in the image plane 8 is 40 mm. The ratio of the distance between the object plane and the mirror M1 and the distance between the object plane 4 and the mirror M2 is 4.13. The mirrors M1 and M4 have a minimum distance between the used reflection surface and the closest imaging light path not acting upon the mirrors (free board) of less than 25 mm. The distances between the pairs of mirrors M2-M3, M4-M5, M5-M6 and the distance between the mirror M6 and the image plane 8 are greater than 40% of the distance between the object plane 4 and the image plane 8.

The optical design data for the reflection surfaces of the mirrors M1 to M6 of the projection optical system 64 can be inferred from the following tables, which correspond to the tables provided for the projection optical system 6 according to FIG. 2.

| Surface | Radius | Thickness | Mode |
|---|---|---|---|
| Object | INFINITY | 413.264 | |
| Mirror 1 | 289.172 | −313.264 | REFL |
| Mirror 2 | 680.603 | 689.549 | REFL |
| Mirror 3 | 333.217 | 0.000 | REFL |
| STOP | INFINITY | −255.285 | |
| Mirror 4 | 400.498 | 908.331 | REFL |
| Mirror 5 | 1757.579 | −620.526 | REFL |
| Mirror 6 | 834.338 | 660.526 | REFL |
| Image | INFINITY | 0.000 | |

| Coeff. | M1 | M2 | M3 | M4 | M5 | M6 |
|---|---|---|---|---|---|---|
| K | −1.030576E+00 | −2.635304E−01 | 4.190202E+00 | −2.532242E−01 | 3.343958E+01 | 2.989093E−01 |
| Y | 0.000000E+00 | 0.000000E+00 | 0.000000E+00 | 0.000000E+00 | 0.000000E+00 | 0.000000E+00 |
| X2 | −6.535480E−04 | −9.651094E−05 | −6.315149E−04 | −1.860891E−04 | 6.210957E−06 | 3.467308E−05 |
| Y2 | −6.703313E−04 | −1.285085E−04 | −5.894828E−04 | −1.055800E−04 | 3.848982E−07 | 3.293719E−05 |
| X2Y | −1.109153E−07 | 9.418989E−09 | 5.191842E−07 | −1.736028E−07 | −3.604297E−08 | −1.901465E−09 |
| Y3 | −1.849968E−07 | 1.804370E−08 | 1.052875E−08 | −3.008104E−07 | −1.255871E−08 | −7.306681E−10 |

-continued

| | | | | | | |
|---|---|---|---|---|---|---|
| X4 | −3.455652E−10 | −6.435672E−11 | −1.959503E−08 | −1.181975E−10 | 9.251123E−10 | 9.219996E−13 |
| X2Y2 | 8.907151E−11 | −1.169230E−10 | −2.854507E−08 | 3.223161E−11 | 1.828013E−09 | 3.292930E−12 |
| Y4 | −6.694084E−09 | −1.746102E−11 | −1.100719E−08 | 5.508116E−10 | 9.590508E−10 | 2.723624E−12 |
| X4Y | −6.682583E−13 | 6.169836E−15 | −4.579394E−11 | −4.554803E−13 | −1.075058E−13 | −9.398044E−17 |
| X2Y3 | −3.764773E−12 | 1.837427E−13 | 8.072483E−13 | −1.108837E−12 | 1.733346E−14 | −1.372960E−15 |
| Y5 | 3.946729E−11 | 1.501209E−15 | 4.522011E−11 | −1.761285E−12 | 5.059303E−14 | −1.418313E−15 |
| X6 | −2.950759E−14 | 5.555342E−16 | −4.772179E−13 | 2.049340E−16 | 1.249728E−15 | 6.302080E−19 |
| X4Y2 | −3.981976E−14 | 7.309283E−17 | −1.369581E−12 | 2.599849E−15 | 4.180701E−15 | 1.406199E−18 |
| X2Y4 | 6.662007E−14 | −1.567936E−16 | −1.344358E−12 | −6.991042E−15 | 4.324557E−15 | 9.589967E−19 |
| Y6 | −6.296271E−14 | 5.254697E−18 | −3.274586E−13 | −1.365187E−15 | 1.317067E−15 | 4.531531E−19 |
| X6Y | 9.572567E−16 | −4.550481E−18 | −2.349696E−17 | −2.327425E−17 | 1.147404E−18 | −5.815673E−22 |
| X4Y3 | 1.729544E−15 | −5.168321E−21 | −6.343836E−16 | −6.844084E−17 | 1.396280E−18 | −1.101533E−21 |
| X2Y5 | 2.003151E−16 | −1.086056E−20 | 7.211912E−17 | 3.651614E−17 | 2.129037E−19 | −6.825077E−22 |
| Y7 | −6.259873E−17 | 0.000000E+00 | 1.314567E−15 | 4.966906E−18 | 4.944608E−20 | −3.674224E−22 |
| X8 | 8.514832E−19 | 5.499001E−21 | −1.315946E−17 | 1.431441E−20 | 5.935619E−21 | 2.351396E−25 |
| X6Y2 | −1.930952E−17 | 1.021410E−20 | −3.809772E−17 | 2.893679E−19 | 2.146809E−20 | 1.941034E−24 |
| X4Y4 | −2.629657E−17 | −5.261250E−22 | −4.023107E−17 | 4.708584E−19 | 2.844557E−20 | 3.285122E−24 |
| X2Y6 | −7.113538E−18 | −2.063344E−22 | −3.710671E−17 | −1.202904E−19 | 1.718587E−20 | 6.947595E−25 |
| Y8 | −6.688170E−19 | −9.807129E−23 | −1.246348E−17 | −1.007426E−20 | 5.947625E−21 | 5.352899E−25 |
| X8Y | −2.167642E−20 | −1.475245E−23 | −4.375451E−20 | −3.593805E−22 | −6.272355E−24 | −6.386618E−29 |
| X6Y3 | 1.577014E−19 | −7.541034E−24 | 1.407216E−21 | −1.733010E−21 | −1.503182E−23 | −2.378905E−27 |
| X4Y5 | 1.475476E−19 | 2.828164E−25 | 2.164416E−19 | −1.819583E−21 | −5.558949E−24 | −4.818316E−27 |
| X2Y7 | 2.386767E−20 | 2.916090E−26 | 4.037031E−19 | 1.506408E−22 | 1.500592E−23 | −2.782420E−27 |
| Y9 | 2.686189E−21 | −3.808616E−26 | 1.365101E−19 | 2.759985E−23 | 9.373049E−24 | 3.697377E−29 |
| X10 | 6.880195E−23 | 4.028878E−27 | −3.684363E−22 | 3.684053E−25 | 8.977447E−27 | 1.376079E−31 |
| X8Y2 | 1.028653E−22 | 7.179210E−27 | −5.946953E−21 | 1.412893E−24 | 6.817863E−26 | −3.343096E−30 |
| X6Y4 | −4.423830E−22 | −2.428875E−28 | −1.431825E−20 | 3.370257E−24 | 1.794556E−25 | −8.790772E−30 |
| X4Y6 | −2.798064E−22 | 1.268239E−28 | −9.083451E−21 | 2.674694E−24 | 2.401259E−25 | −2.285964E−30 |
| X2Y8 | −1.113049E−23 | −1.289425E−30 | 4.131039E−22 | −1.824536E−27 | 1.599496E−25 | 5.901778E−30 |
| Y10 | 1.536113E−24 | 0.000000E+00 | 9.866128E−22 | 9.363641E−28 | 1.894848E−26 | 1.501949E−30 |
| Nradius | 1.00E+00 | 1.00E+00 | 1.00E+00 | 1.00E+00 | 1.00E+00 | 1.00E+00 |

| Coefficient | M1 | M2 | M3 | M4 | M5 | M6 |
|---|---|---|---|---|---|---|
| Y-decenter | 76.368 | −281.911 | 194.003 | −24.759 | 94.122 | 96.437 |
| X-rotation | −6.675 | 24.349 | 2.204 | 25.034 | −0.109 | −0.453 |

Figure 16:
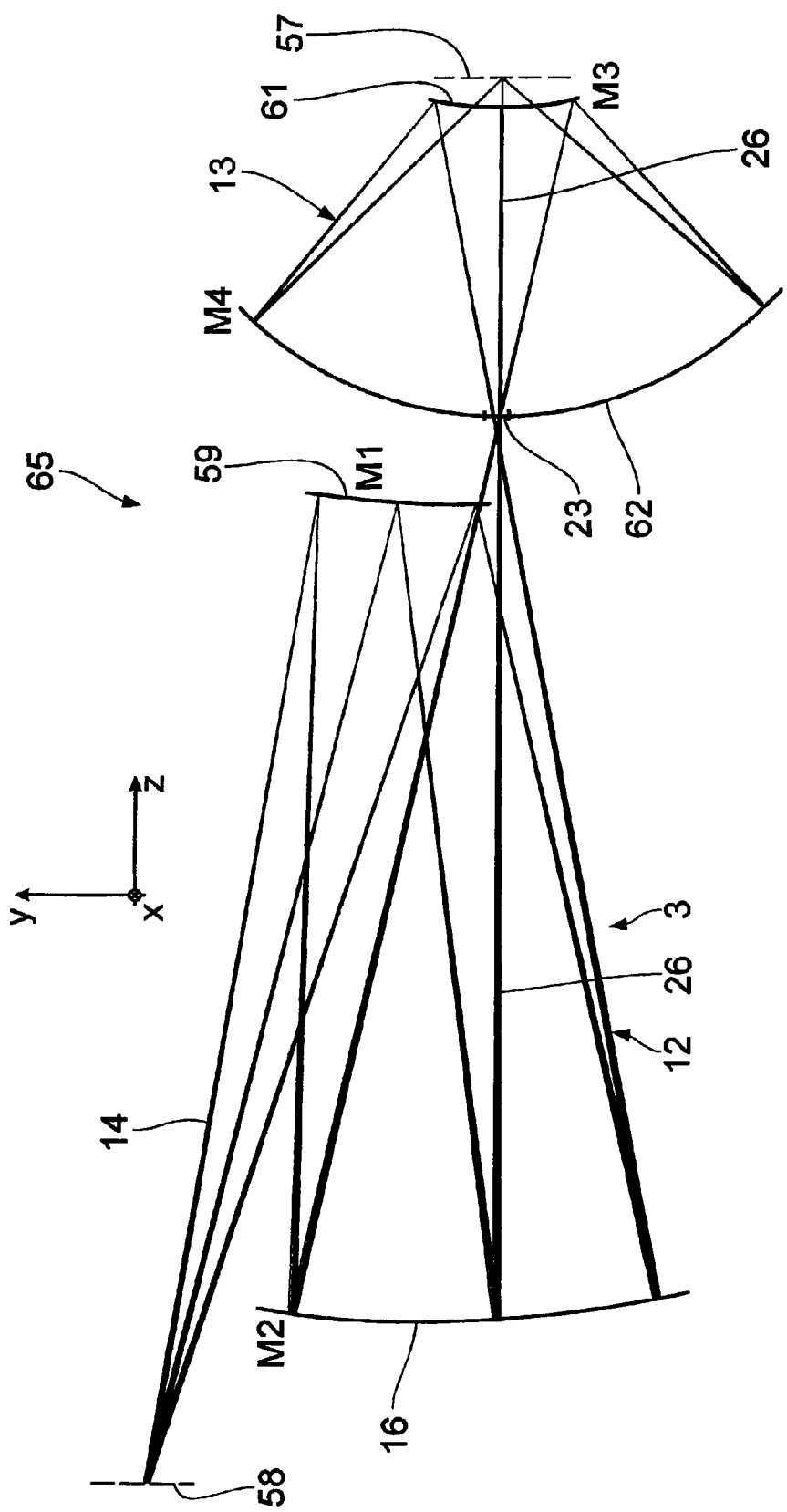
FIGS. 16 and 17 show views similar to that of FIG. 13 of a microscope lens for inspecting wafers.
Figure 17:
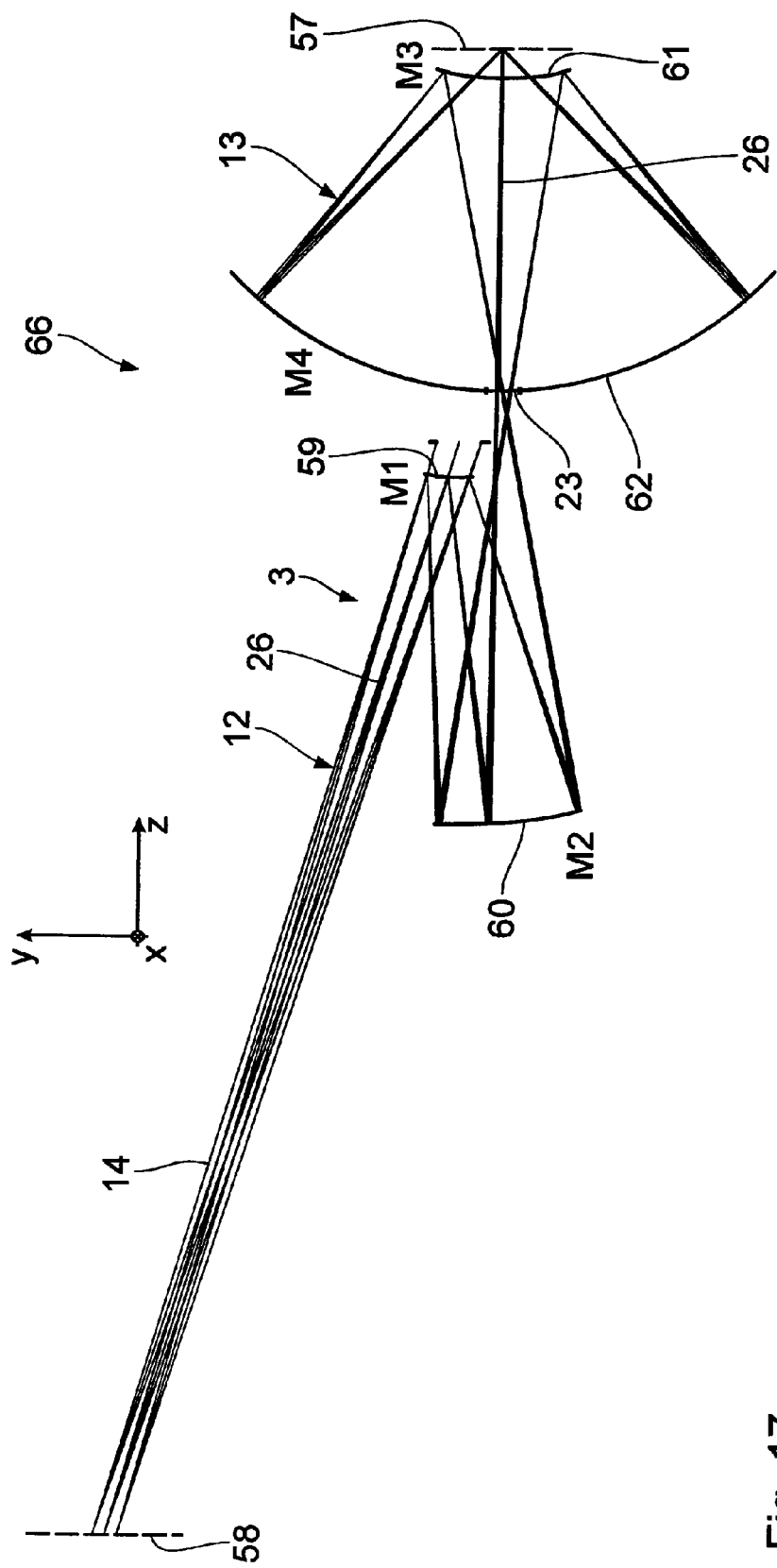

In the following more optical data for two further microscope lenses 65, 66 are summarised which, like the microscope lens 56, can be used for inspecting projection masks required for projection exposure or lithography or for inspecting exposed wafers. Both of these further microscope lenses 65, 66 are shown in FIGS. 16 and 17. The basic four-mirror construction of the two further microscope lens 65, 66 corresponds to that of FIG. 13.

Components in these further microscope lenses 65, 66, which correspond to those which have previously been explained in relation to the microscope lens 56, have the same reference numerals or designations.

The first of the two further microscope lenses 65, 66, the microscope lens 65, shown in FIG. 16, has an object-side numerical aperture of 0.8. The dimensions of the square object field are 0.8×0.8 mm². The increasing magnification level is 10×. The wavelength of the illumination light 3 is 193.0 nm. Other illumination light wavelengths are also possible, for example a visible wavelength or an EUV wavelength. The sequence of the optical effects of the mirrors M1 to M4 (negative N; positive P) is NPNP. The single intermediate image is located between the mirrors M2 and M3 at the location of the through-hole 23 in the mirror M4. Principal rays travel out of the microscope lens 65 in a divergent manner from the microscope image plane 58. The z-distance between the substrate plane 57 and the image plane 58 is 1,933 mm. The object-image shift is 477 mm. 21.5% of the illuminated surfaces in the pupil planes are obscured. The microscope lens 65 has a wavefront error (rms) of 0.004 in units of the wavelength of the illumination light 3. The angle of the principal ray at the central object field point is 13.8°. The mirror M1 has dimensions (x/y) of 219×216 mm². The mirror M2 has dimensions of 520×502 mm². The mirror M3 has dimensions of 202×189 mm². The mirror M4 has dimensions of 742×699 mm². The sequence of the principal ray angle of incidence of the principal ray 26 of the central object field point on the mirrors M1 to M4 is 10.48°, 3.53°, 0.04° and 0.02°. The sequence of the maximum angle of incidence on the mirrors M1 to M4 is 15.70°, 5.58°, 27.79° and 3.19°. The sequence of the bandwidths of the angle of incidence on the mirrors M1 to M4 is 11.93°, 4.46°, 27.79° and 3.19°. The working distance in the microscope image plane 58 is 240 mm. The working distance in the substrate plane 57 is 40 mm. The ratio of the distance between the microscope image plane 58 and the mirror M1 and the distance between the microscope image plane 58 and the mirror M2 is 5.63. The distance between the substrate plane 57 and the mirror M1 and the distances between the pairs of mirrors M1-M2 and M2-M3 are greater than 40% of the distance between the substrate plane 57 and the image plane 58.

The optical design data for the reflection surfaces of the mirrors M1 to M4 of the microscope lens 65 can be gathered from the following tables, which correspond to the tables for the previously described projection optical systems. In these tables "object" refers to the microscope image plane 58. "Image" refers to the substrate plane 57.

| Surface | Radius | Thickness | Mode |
|---|---|---|---|
| Object | INFINITY | 1350.229 | |
| Mirror 1 | 240.546 | −1110.493 | REFL |
| Mirror 2 | 435.560 | 1653.485 | REFL |
| Mirror 3 | 756.829 | −422.992 | REFL |
| Mirror 4 | 530.970 | 462.991 | REFL |
| Image | INFINITY | 0.000 | |

| Coefficient | M1 | M2 | M3 | M4 |
|---|---|---|---|---|
| K | −1.387402E+00 | −9.186277E−01 | 2.479623E+01 | 1.846234E−01 |
| Y | 0.000000E+00 | 0.000000E+00 | 0.000000E+00 | 0.000000E+00 |
| X2 | −1.972513E−03 | −8.152652E−04 | 4.304599E−04 | 3.443510E−05 |
| Y2 | −2.046135E−03 | −8.219532E−04 | 4.280214E−04 | 3.442623E−05 |
| X2Y | 4.924422E−07 | 1.043274E−08 | 1.420911E−07 | −1.467857E−09 |
| Y3 | 3.892760E−07 | 1.233789E−08 | 1.433179E−07 | −1.285787E−09 |
| X4 | 2.843271E−09 | −8.849537E−11 | 5.644150E−09 | 5.790124E−12 |
| X2Y2 | 6.307229E−09 | −1.868473E−10 | 1.095525E−08 | 1.192799E−11 |
| Y4 | 3.357640E−09 | −9.886660E−11 | 5.323173E−09 | 6.015673E−12 |
| X4Y | 3.303637E−13 | 1.821786E−14 | −9.065558E−13 | 2.636707E−15 |
| X2Y3 | 4.517153E−13 | 3.654773E−14 | −1.999032E−12 | 4.573973E−15 |
| Y5 | −1.472281E−14 | 1.913697E−14 | −1.039223E−12 | 1.907361E−15 |
| X6 | −1.567647E−14 | −2.778349E−17 | 3.227077E−14 | 6.941174E−18 |
| X4Y2 | −4.271994E−14 | −8.658416E−17 | 9.037002E−14 | 1.569376E−17 |
| X2Y4 | −3.766656E−14 | −8.931045E−17 | 8.435334E−14 | 1.111043E−17 |
| Y6 | −1.062731E−14 | −3.096033E−17 | 2.620546E−14 | 2.369368E−18 |
| X6Y | 0.000000E+00 | 0.000000E+00 | 0.000000E+00 | 0.000000E+00 |
| X4Y3 | 0.000000E+00 | 0.000000E+00 | 0.000000E+00 | 0.000000E+00 |
| X2Y5 | 0.000000E+00 | 0.000000E+00 | 0.000000E+00 | 0.000000E+00 |
| Y7 | 0.000000E+00 | 0.000000E+00 | 0.000000E+00 | 0.000000E+00 |
| X8 | 0.000000E+00 | 0.000000E+00 | 0.000000E+00 | 0.000000E+00 |
| X6Y2 | 0.000000E+00 | 0.000000E+00 | 0.000000E+00 | 0.000000E+00 |
| X4Y4 | 0.000000E+00 | 0.000000E+00 | 0.000000E+00 | 0.000000E+00 |
| X2Y6 | 0.000000E+00 | 0.000000E+00 | 0.000000E+00 | 0.000000E+00 |
| Y8 | 0.000000E+00 | 0.000000E+00 | 0.000000E+00 | 0.000000E+00 |
| X8Y | 0.000000E+00 | 0.000000E+00 | 0.000000E+00 | 0.000000E+00 |
| X6Y3 | 0.000000E+00 | 0.000000E+00 | 0.000000E+00 | 0.000000E+00 |
| X4Y5 | 0.000000E+00 | 0.000000E+00 | 0.000000E+00 | 0.000000E+00 |
| X2Y7 | 0.000000E+00 | 0.000000E+00 | 0.000000E+00 | 0.000000E+00 |
| Y9 | 0.000000E+00 | 0.000000E+00 | 0.000000E+00 | 0.000000E+00 |
| X10 | 0.000000E+00 | 0.000000E+00 | 0.000000E+00 | 0.000000E+00 |
| X8Y2 | 0.000000E+00 | 0.000000E+00 | 0.000000E+00 | 0.000000E+00 |
| X6Y4 | 0.000000E+00 | 0.000000E+00 | 0.000000E+00 | 0.000000E+00 |
| X4Y6 | 0.000000E+00 | 0.000000E+00 | 0.000000E+00 | 0.000000E+00 |
| X2Y8 | 0.000000E+00 | 0.000000E+00 | 0.000000E+00 | 0.000000E+00 |
| Y10 | 0.000000E+00 | 0.000000E+00 | 0.000000E+00 | 0.000000E+00 |
| Nradius | 1.000000E+00 | 1.000000E+00 | 1.000000E+00 | 1.000000E+00 |
| Y-decenter | −419.012 | −607.162 | −478.467 | −476.646 |
| X-rotation | −2.721 | 8.467 | 0.209 | −0.024 |

The optical data for the second microscope lens 66, which is shown in FIG. 17 and can also be used instead of the microscope lens 56 in FIG. 13, are summarised in the following:

The object-side numerical aperture NA is 0.8. The dimensions of the square object field are 0.8×0.8 mm². The increasing magnification level is 40×. The wavelength of the illumination light 3 is 193.0 nm. Other illumination light wavelengths may also be used, for example visible or EUV wavelengths. The sequence of the optical effects of the mirrors M1 to M4 (negative N; positive P) is NPNP. The single intermediate image is located between the mirrors M2 and M3 in the region of the through-hole 23 in the mirror M4. On the image-side, principal rays travel out of the microscope lens 66 in a divergent manner. The z-distance between the substrate plane 57 and the image plane 58 is 2,048 mm. The object-image shift is 522 mm. 24.6% of the surfaces illuminated in the pupil planes are obscured. The microscope lens 66 has a wavefront error (rms) of 0.016 in units of the wavelength of the illumination light 3. The angle of the principal ray at the central object field point is 17.1°. The mirror M1 has dimensions (x/y) of 59×58 mm². The mirror M2 has dimensions of 222×197 mm². The mirror M3 has dimensions of 180×163 mm². The mirror M4 has dimensions of 736×674 mm². The sequence of the principal ray angle of incidence of the principal ray 26 of the central object field point to the mirrors M1 to M4 is 12.23°, 3.81°, 0.10° and 0.14°. The sequence of the maximum angle of incidence on the mirrors M1 to M4 is 18.94°, 5.66°, 24.95° and 2.75°. The sequence of the bandwidths of the angle of incidence on the mirrors M1 to M4 is 10.17°, 1.81°, 24.95° and 2.75°. The working distance in the microscope image plane 58 is 996 mm. The working distance in the substrate plane 57 is 40 mm. The ratio of the distance between the microscope image plane 58 and the mirror M1 and the distance between the microscope image plane 58 and the mirror M2 is 1.46. The distance between the substrate plane 57 and the mirror M1 and the distance between the pair of mirrors M2-M3 is less than 40% of the distance between the substrate plane 57 and the image plane 58.

The optical design data for the reflection surfaces of the mirrors M1 to M4 of the microscope lens 66 can be gathered from the following tables, which correspond to the tables for the previously described microscope lens 65.

| Surface | Radius | Thickness | Mode |
|---|---|---|---|
| Object | INFINITY | 1458.431 | |
| Mirror 1 | 138.358 | −462.391 | REFL |
| Mirror 2 | 352.350 | 1011.807 | REFL |
| Mirror 3 | 521.060 | −429.417 | REFL |
| Mirror 4 | 523.773 | 469.415 | REFL |
| Image | INFINITY | 0.000 | |

| Coefficient | M1 | M2 | M3 | M4 |
|---|---|---|---|---|
| K | 2.186021E−01 | −8.967130E−01 | 1.353344E+01 | 1.426428E−01 |
| Y | 0.000000E+00 | 0.000000E+00 | 0.000000E+00 | 0.000000E+00 |
| X2 | −2.119566E−03 | −6.122040E−04 | 3.598902E−04 | 2.150055E−05 |
| Y2 | −1.870353E−03 | −6.339662E−04 | 4.023778E−04 | 2.187467E−05 |
| X2Y | −2.390768E−05 | 6.494155E−08 | −2.453628E−07 | 3.235225E−09 |
| Y3 | −2.981028E−05 | 5.780210E−08 | −6.744637E−08 | 4.604016E−09 |
| X4 | 1.923306E−08 | 2.795937E−10 | 2.925492E−09 | −1.313710E−12 |
| X2Y2 | 4.121148E−07 | 5.095698E−10 | 1.819466E−09 | −5.092789E−12 |
| Y4 | 4.757534E−07 | 2.387275E−10 | −6.547683E−10 | −2.809211E−12 |
| X4Y | −1.446899E−09 | 5.301791E−13 | −9.735433E−12 | −3.703196E−15 |
| X2Y3 | −7.970490E−09 | 8.235778E−13 | −4.591548E−11 | −1.311139E−14 |
| Y5 | −6.911626E−09 | 5.427574E−13 | −3.434264E−11 | −8.056144E−15 |
| X6 | −6.957804E−12 | 4.031055E−16 | 4.869018E−14 | −2.032419E−18 |
| X4Y2 | −6.520224E−12 | 3.388642E−15 | 1.730353E−13 | −5.277652E−18 |
| X2Y4 | 5.785767E−11 | 4.106532E−15 | 8.768509E−14 | −5.976002E−18 |
| Y6 | 5.002226E−11 | −2.665419E−15 | −1.533312E−14 | 3.256782E−19 |
| X6Y | 3.978450E−14 | −3.458637E−18 | 2.808257E−16 | −2.974086E−21 |
| X4Y3 | 1.060921E−15 | −5.135846E−18 | 1.062927E−15 | −1.985462E−20 |
| X2Y5 | −2.907745E−13 | 1.367522E−17 | 1.248668E−15 | −1.673351E−20 |
| Y7 | −1.895272E−13 | 2.948597E−17 | 4.722358E−16 | −2.273773E−22 |
| X8 | 0.000000E+00 | 9.742461E−21 | −1.224565E−19 | −5.498909E−24 |
| X6Y2 | 0.000000E+00 | −1.149790E−22 | −8.469691E−19 | −3.121995E−23 |
| X4Y4 | 0.000000E+00 | −3.605842E−20 | −9.612391E−19 | −9.354588E−23 |
| X2Y6 | 0.000000E+00 | −8.956173E−20 | 3.862422E−20 | −1.029099E−22 |
| Y8 | 0.000000E+00 | −6.962503E−20 | 1.096441E−19 | −3.729022E−23 |
| X8Y | 0.000000E+00 | 0.000000E+00 | 0.000000E+00 | 0.000000E+00 |
| X6Y3 | 0.000000E+00 | 0.000000E+00 | 0.000000E+00 | 0.000000E+00 |
| X4Y5 | 0.000000E+00 | 0.000000E+00 | 0.000000E+00 | 0.000000E+00 |
| X2Y7 | 0.000000E+00 | 0.000000E+00 | 0.000000E+00 | 0.000000E+00 |
| Y9 | 0.000000E+00 | 0.000000E+00 | 0.000000E+00 | 0.000000E+00 |
| X10 | 0.000000E+00 | 0.000000E+00 | 0.000000E+00 | 0.000000E+00 |
| X8Y2 | 0.000000E+00 | 0.000000E+00 | 0.000000E+00 | 0.000000E+00 |
| X6Y4 | 0.000000E+00 | 0.000000E+00 | 0.000000E+00 | 0.000000E+00 |
| X4Y6 | 0.000000E+00 | 0.000000E+00 | 0.000000E+00 | 0.000000E+00 |
| X2Y8 | 0.000000E+00 | 0.000000E+00 | 0.000000E+00 | 0.000000E+00 |
| Y10 | 0.000000E+00 | 0.000000E+00 | 0.000000E+00 | 0.000000E+00 |
| Nradius | 1.000000E+00 | 1.000000E+00 | 0.000000E+00 | 0.000000E+00 |
| Y-decenter | −473.594 | −625.447 | −517.418 | −517.782 |
| X-rotation | −2.590 | 13.500 | −1.408 | −0.608 |

Other embodiments are in the claims.

What is claimed is:

1. An imaging optical system having an image plane, an object plane and a pupil plane, the optical system comprising:
a plurality of mirrors,
wherein during use of the imaging optical system:
the plurality of mirrors images an object field in the object plane into an image field in the image plane,
surfaces of the pupil plane are illuminated; and
at most 11.6% of the illimunated surfaces of the pupil plane are obscured.

2. The imaging optical system of claim 1, wherein during use of the imaging optical system at most 9.2% of the illimunated surfaces of the pupil plane are obscured.

3. The imaging optical system of claim 1, wherein during use of the imaging optical system at most 6.4% of the illimunated surfaces of the pupil plane are obscured.

4. The imaging optical system of claim 1, wherein during use of the imaging optical system at most 5.9% of the illimunated surfaces of the pupil plane are obscured.

5. The imaging optical system of claim 1, wherein during use of the imaging optical system at most 5.7% of the illimunated surfaces of the pupil plane are obscured.

6. The imaging optical system of claim 1, wherein at least one of the plurality of mirrors has a through-hole.

7. The imaging optical system of claim 1, wherein:
during use of the optical imaging system, imaging light passes through the optical imaging system along a path; and
at least one of the plurality of mirrors has a through-hole in the path.

8. The imaging optical system of claim 1, wherein a reflection surface of at least one of the plurality of mirrors is a free-form surface which cannot be described by a rotationally symmetrical function.

9. The imaging optical system of claim 1, wherein the imaging optical system has an object-image shift of greater than 100 mm.

10. The imaging optical system of claim 1, wherein the image plane is arranged parallel to the object plane.

11. The imaging optical system of claim 1, wherein during use of the imaging optical system imaging light is reflected by the plurality of mirrors with a maximum angle of reflection of 25°.

12. The imaging optical system of claim 11, wherein a quotient of a maximum angle of reflection of the imaging light within the imaging optical system and a numerical aperture thereof on the image side is at most 40°.

13. The imaging optical system of claim 1, wherein:
during use of the optical imaging system, imaging light passes through the optical imaging system along a path; and
a mirror of the plurality of mirrors:
is arranged before a last mirror in the path in a region of the pupil plane; and
has a convex basic shape.

14. The imaging optical system of claim 1, wherein the plurality of mirrors comprises at least four mirrors.

15. The imaging optical system of claim 1, wherein the plurality of mirrors consists of six mirrors.

16. The imaging optical system of claim 1, wherein at least two of the plurality of mirrors have negative angular magnification of the principal ray.

17. The imaging optical system of claim 16, wherein a mirror with positive angular magnification of a principal ray is arranged between two mirrors with negative angular magnification of the principal ray.

18. The imaging optical system of claim 1, wherein a central imaging beam, directed through a through hole of a last mirror and centrally through a pupil, of a central object point encloses an angle of greater than 85° relative to the image plane.

19. The imaging optical system of claim 1, wherein:
during use of the optical imaging system, imaging light passes through the optical imaging system along a path;
the path passes through a last mirror and has an intermediate image in an intermediate image plane in a region of a through-hole in the mirror; and
a portion of the optical system between the object plane and the intermediate image plane has a reducing magnification level of at least 2×.

20. The imaging optical system of claim 1, wherein:
during use of the optical imaging system, imaging light passes through the optical imaging system along a path;
a penultimate mirror in the path and from which the imaging light is reflected to a last mirror has a through-hole configured to allow imaging light to pass therethrough; and
the image plane being arranged behind the penultimate mirror so as to be off-center by not more than a fifth of the diameter of the penultimate mirror.

21. The imaging optical system of claim 20, wherein the penultimate mirror in the imaging light path has a radius of curvature greater than 500 mm.

22. The imaging optical system of claim 1, wherein:
during use of the optical imaging system, imaging light passes through the optical imaging system along a path;
a penultimate mirror in the path and from which the imaging light is reflected to a last mirror has a through-hole configured to allow imaging light to pass therethrough; and
the image plane being arranged behind the penultimate mirror so as to be central, relative to the penultimate mirror.

23. The imaging optical system of claim 1, wherein during use the imaging optical system illuminates an image field greater than 1 mm$^2$.

24. The imaging optical system of claim 1, wherein the imaging optical system has a numerical aperture on the image side of at least 0.4.

25. The imaging optical system of claim 1, wherein the imaging optical system is telecentric on the image side.

26. The imaging optical system of claim 1, comprising at least one pair of adjacent mirrors which are at a distance from one another, perpendicular to at least one of the object plane and the image plane, of more than 40% of the distance between the object field and the image field.

27. The imaging optical system of claim 1, wherein at least one mirror has a minimum distance of less than 25 mm from the reflection surface used to the closest imaging light path not acting upon the mirror.

28. A projection exposure installation, comprising:
the imaging optical system of claim 1; and
an illumination optics configured to direct illumination light to the object field of the imaging optical system,
wherein the projection exposure installation is a microlithography projection exposure installation.

29. The projection exposure installation of claim 28, further comprising a light source configured to generate illumination light having a wavelength of between 10 and 30 nm.

30. A method, comprising:
using a microlithography projection exposure installation to produce a microstructure on a wafer,
wherein the microlithography projection exposure installation comprises:
the imaging optical system of claim 1; and
an illumination optics configured to direct illumination light to the object field of the imaging optical system.

31. A method of claim 30, wherein the method comprises:
providing a reticle and a wafer, and
projecting a structure on the reticle onto a light-sensitive layer of the wafer to produce the microstructure on the wafer.

* * * * *

UNITED STATES PATENT AND TRADEMARK OFFICE
CERTIFICATE OF CORRECTION

| | | |
|---|---|---|
| PATENT NO. | : 8,967,817 B2 | Page 1 of 1 |
| APPLICATION NO. | : 14/013066 | |
| DATED | : March 3, 2015 | |
| INVENTOR(S) | : Hans-Juergen Mann | |

It is certified that error appears in the above-identified patent and that said Letters Patent is hereby corrected as shown below:

In the Specification

Col. 4, line 33, delete "curature" and insert -- curvature --.

Col. 8, line 33, delete "20" and insert -- 21 --.

Col. 9, line 59, delete "d," and insert -- $d_i$ --.

Col. 9, line 62, delete "d," and insert -- $d_i$ --.

Col. 10, line 52, delete "reflection a" and insert -- reflection $\alpha$ --.

Col. 11, line 2, delete "reflection y" and insert -- reflection $\gamma$ --.

Col. 12, line 46, delete "decentred" and insert -- decentered --.

Col. 14, line 40, delete "reflection a," and insert -- reflection $\alpha$, --.

In the Claims

Col. 31, line 48, Claim 1, delete "illumunated" and insert -- illuminated --.

Col. 31, line 51, Claim 2, delete "illumunated" and insert -- illuminated --.

Col. 31, line 54, Claim 3, delete "illumunated" and insert -- illuminated --.

Col. 31, line 57, Claim 4, delete "illumunated" and insert -- illuminated --.

Col. 31, line 60, Claim 5, delete "illumunated" and insert -- illuminated --.

Signed and Sealed this
Twenty-fifth Day of August, 2015

Michelle K. Lee
*Director of the United States Patent and Trademark Office*